United States Patent
Li

(10) Patent No.: US 12,401,363 B2
(45) Date of Patent: Aug. 26, 2025

(54) LEVEL-AWARE BIAS VOLTAGE GENERATOR AND SEMICONDUCTOR DEVICE

(71) Applicant: TAIWAN SEMICONDUCTOR MANUFACTURING COMPANY LTD., Hsinchu (TW)

(72) Inventor: Gu-Huan Li, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 64 days.

(21) Appl. No.: 18/403,645

(22) Filed: Jan. 3, 2024

(65) Prior Publication Data

US 2025/0211232 A1  Jun. 26, 2025

Related U.S. Application Data

(60) Provisional application No. 63/614,660, filed on Dec. 25, 2023.

(51) Int. Cl.
*H03K 19/0185* (2006.01)
*G11C 17/18* (2006.01)

(52) U.S. Cl.
CPC ..... *H03K 19/018521* (2013.01); *G11C 17/18* (2013.01)

(58) Field of Classification Search
None
See application file for complete search history.

(56) References Cited

U.S. PATENT DOCUMENTS

| | | | |
|---|---|---|---|
| 10,205,441 B1* | 2/2019 | Abhishek | H03K 5/003 |
| 11,277,121 B1* | 3/2022 | Goyal | H03K 3/356113 |
| 12,283,951 B2* | 4/2025 | Yu | H03K 19/018521 |
| 12,283,952 B2* | 4/2025 | Chinthu | H03K 19/018521 |

* cited by examiner

*Primary Examiner* — Jeffrey S Zweizig
(74) *Attorney, Agent, or Firm* — WPAT LAW; Anthony King

(57) ABSTRACT

The present disclosure provides a semiconductor device and a bias voltage generator. The semiconductor device includes a voltage divider, a voltage selection circuit, and a level shifter. The voltage divider is configured to divide a power supply voltage to generate a first bias voltage. The voltage selection circuit is configured to select between the first bias voltage and a reference voltage to output a second bias voltage. The level shifter is configured to adjust a voltage level of the power supply voltage using the first bias voltage and the second bias voltage.

20 Claims, 27 Drawing Sheets

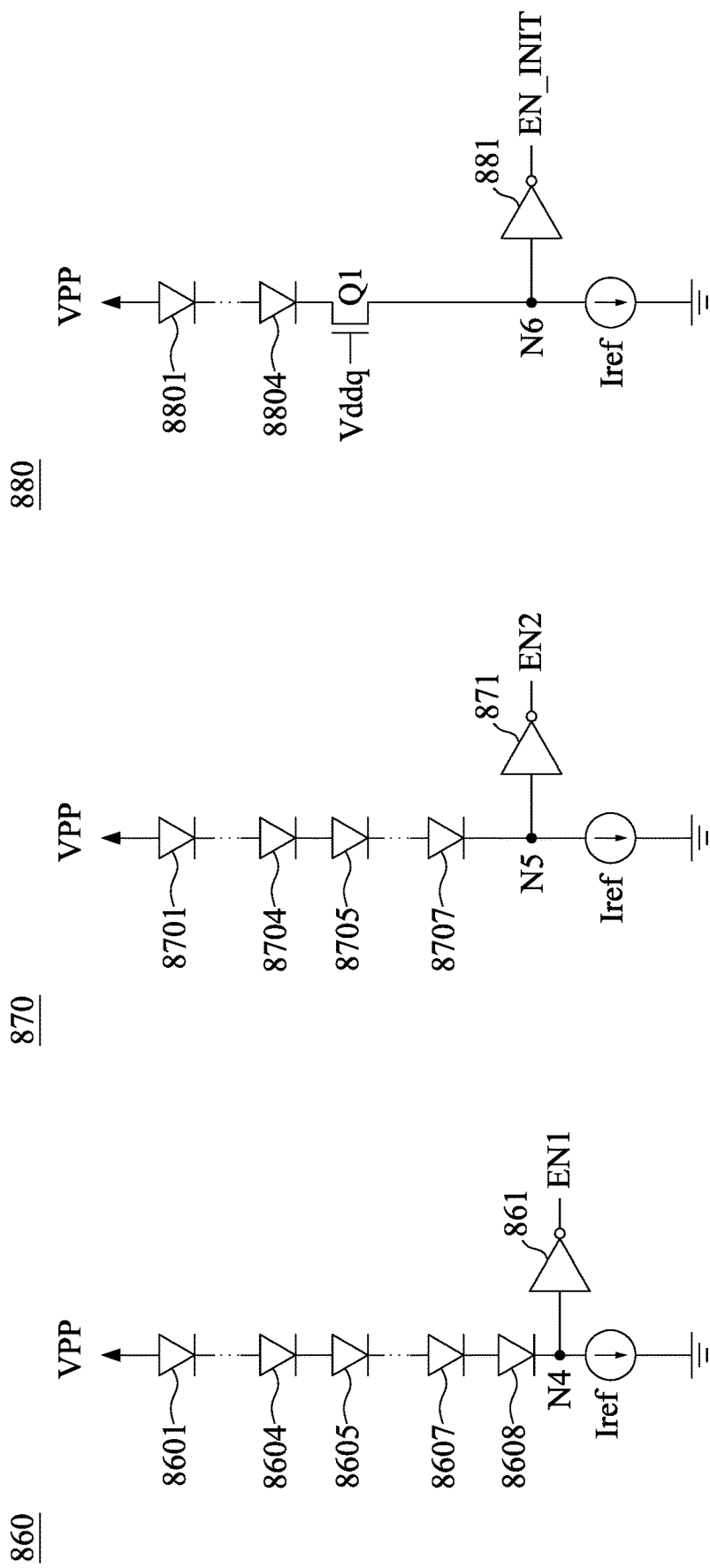

LEVEL-AWARE BIAS VOLTAGE GENERATOR AND SEMICONDUCTOR DEVICE

CROSS-REFERENCE TO RELATED APPLICATIONS

This application claims the benefit of U.S. Provisional Application No. 63/614,660, filed Dec. 25, 2023, the entire disclosure of which is incorporated by reference herein.

BACKGROUND

The present disclosure relates to electronic circuits, and, in particular, to a level-aware bias voltage generator and a semiconductor device.

Non-volatile memory (NVM) is usually equipped in integrated circuitry. For some types of non-volatile memories, a high programming voltage is needed to perform a write operation and change the logic state of selected non-volatile memory cells. However, existing level shifters providing the high programming voltage may have a narrow voltage operating range, and may not work well during voltage ramp-up period (e.g., the programming voltage is provided by a charge pump), which may cause potential function risks.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

FIGS. 8C to 8E are schematic diagrams illustrating level detectors in the voltage divider 800 of FIG. 8A.

DETAILED DESCRIPTION

Figure 1:
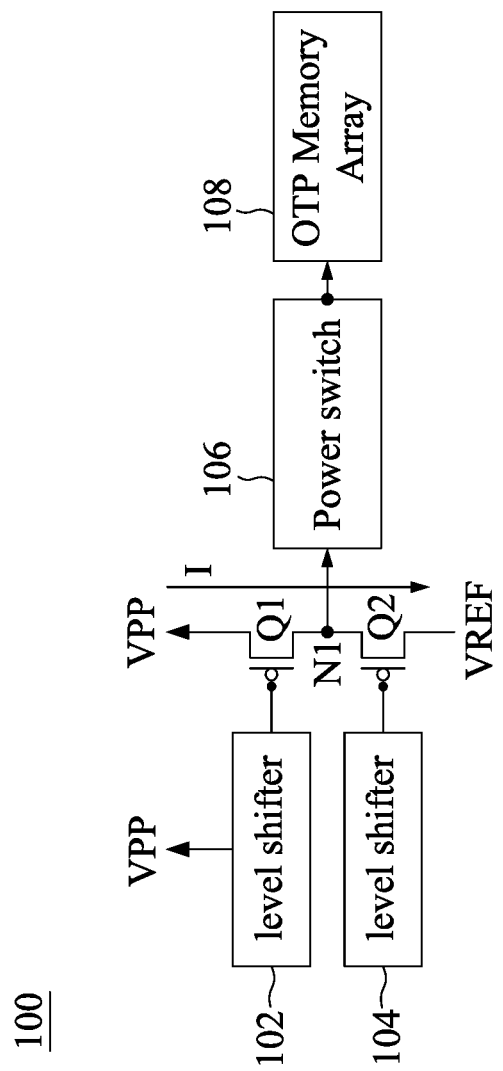
FIG. 1 is a schematic diagram of a semiconductor device 100 in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, it will be understood that when an element is referred to as being "connected to" or "coupled to" another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic diagram of a semiconductor device 100 in accordance with an embodiment of the present disclosure.

In some embodiments, the semiconductor device 100 may include level shifters 102 and 104, transistors Q1 and Q2, a power switch 106, and a one-time-programmable (OTP) memory array 108, as depicted in FIG. 1. The level shifters 102 and 104 may be supplied with a power supply voltage VPP. The level shifters 102 and 104 may change the voltage level of the power supply voltage VPP to generate respective output voltages. The output voltage of the level shifter 102 may be used to control the transistor Q1, and that of the level shifter 104 may be used to control the transistor Q2. The transistor Q1 may be coupled between the power supply voltage VPP and node N1, and the transistor Q2 may be coupled between node N1 and a reference voltage VREF. The voltage at node N1 may be input to the power switch 106 configured to control the phase of programming voltages provided to the selected memory cells in the OTP memory array 108.

In some embodiments, the power supply voltage VPP may be generated by a charge pump (not shown). Upon the charge pump being activated, the power supply voltage output by the charge pump will gradually increase from 0V to the power supply voltage VPP. The duration of voltage increase can be regarded as a voltage ramp-up period or a power-on period. The level shifters 102 and 104 may not be well controlled during the voltage ramp-up period of the power supply voltage such that the transistors Q1 and Q2 are turned on, and a current I flows through the power supply voltage VPP to the reference voltage VREF. In some embodiments, when the power switch 106 fails, it may cause potential mis-programming of the OTP memory array 108.

Figure 2B:
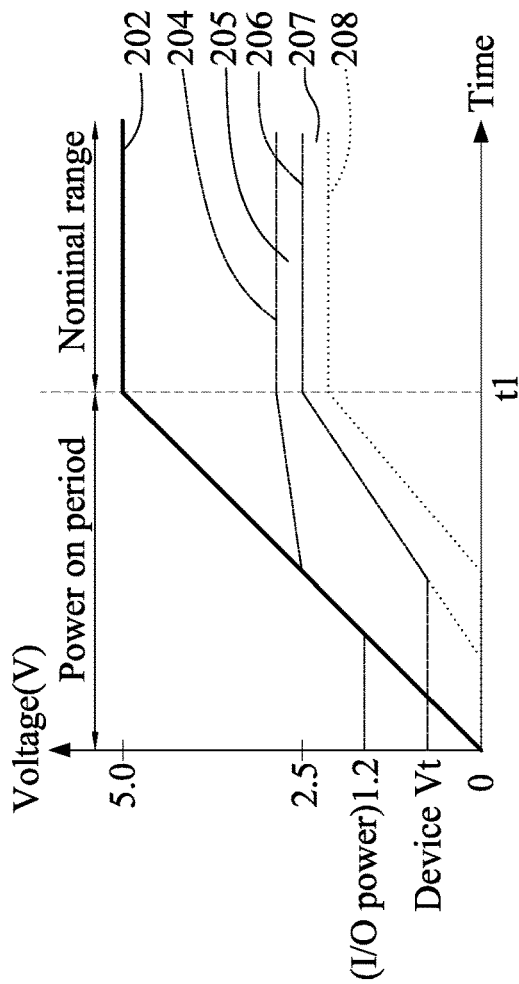
FIG. 2B is a diagram illustrating the operating range of the level shifter of FIG. 2A.
Figure 2A:
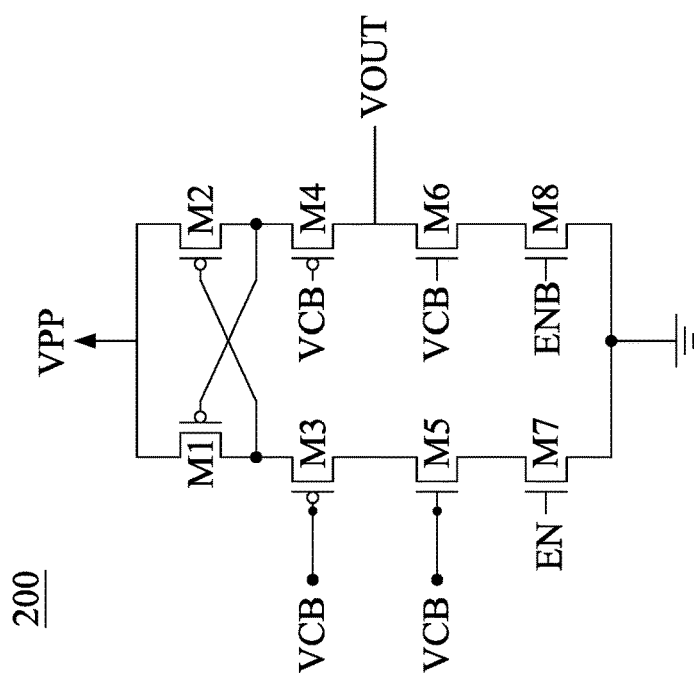
FIG. 2A is a schematic diagram of a level shifter 200 in accordance with an embodiment of the present disclosure.

FIG. 2A is a schematic diagram of a level shifter 200 in accordance with an embodiment of the present disclosure. FIG. 2B is a diagram illustrating the operating range of the level shifter of FIG. 2A.

In some embodiments, when the power supply voltage VPP is greater than the operating range of the transistors fabricated by a given process, the level shifters 102 and 104 can be implemented using the level shifter 200 shown in FIG. 2A. For example, the level shifter 200 may include transistors M1 to M8. The transistors M1, M3, M5, and M7 are connected in series (e.g., a cascoded architecture), and the transistors M2, M4, M6, and M8 are also connected in series (e.g., another cascoded architecture). The transistors M3 to M6 are controlled by a cascoded bias voltage VCB. The transistors M7 and M8 are controlled by an enable signal EN and an inverse enable signal ENB. The output voltage VOUT may be generated at the node between transistors M4 and M6.

In some embodiments, in order to mitigate reliability risks and reduce voltage stress across any two terminals (e.g., including gate, drain, source, body) in each of the transistors M1 to M8, the cascoded bias voltage VCB may be designed to be equal to VPP/2 for nominal operations. The transistors M1 to M8 are I/O devices with 1.2V voltage tolerance. Given that power supply voltage VPP=5V and the cascade bias voltage VCB is kept at 2.5V, the voltage stress across any two terminals (e.g., including gate, drain, source, body) in each of the transistors M1 to M8 may be approximately 2.5V.

In some embodiments, considering the VPP ramp-up or ramp-down condition, VCB=VPP/2 may be not suitable for the full range of the power supply voltage VPP. For example, the N-type transistors M5 to M6 and P-type transistors M3 to M4 may have different operating ranges, especially when the power supply voltage VPP is close to 0V. In some embodiments, the target voltage of the power supply voltage VPP is 5V, and the threshold voltage of the transistors M1 to M8 is approximately 0.5V. Curve 202 shows the power supply voltage VPP over time. Region 207 between curves 206 and 208 may refer to the operating range of the P-type transistors M3 and M4, and region 205 between curves 204 and 206 may refer to the operating range of the N-type transistors M5 and M6.

For example, when the cascoded bias voltage VCB is lower than the threshold voltage (e.g., device Vt shown in FIG. 2B) of the N-type transistors M5 and M6, the N-type transistors M5 and M6 will not be turned on, and the level shifter 200 cannot work normally. When the power supply voltage VPP is 0V, the cascoded bias voltage VCB cannot exceed the tolerable voltage stress (e.g., 1.2V) of the N-type transistors M5 and M6. When the difference between the power supply voltage VCB and the cascoded bias voltage VCB is not greater than the threshold voltage of the P-type transistors M3 and M4, the P-type transistors M3 and M4 will not be turned on, and the level shifter 200 cannot work normally.

Figure 3B:
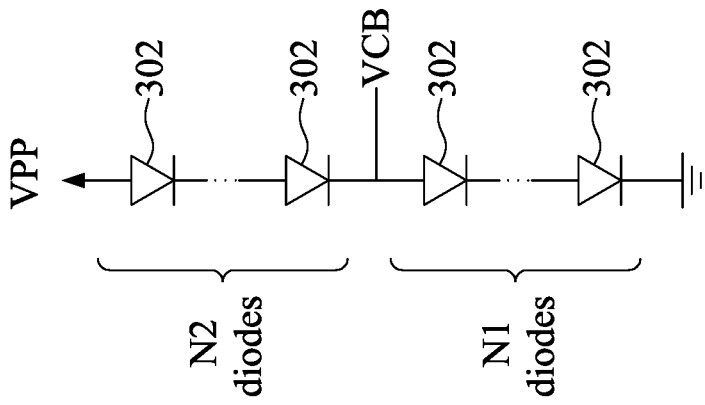
FIG. 3B is a schematic diagram of a voltage divider 300B in accordance with another embodiment of the present disclosure.
Figure 3A:
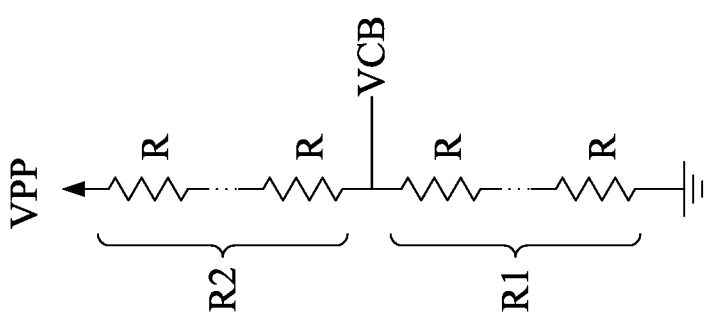
FIG. 3A is a schematic diagram of a voltage divider 300A in accordance with an embodiment of the present disclosure.

FIG. 3A is a schematic diagram of a voltage divider 300A in accordance with an embodiment of the present disclosure. FIG. 3B is a schematic diagram of a voltage divider 300B in accordance with another embodiment of the present disclosure.

In an embodiment, the cascoded bias voltage VCB shown in FIG. 2A can be generated by the voltage divider 300A shown in FIG. 3A. The voltage divider 300A includes a plurality of resistors R. The equivalent resistance of the upper portion of the voltage divider 300A is R2, and that of the lower portion of the voltage divider 300A is R1. Thus, the cascoded bias voltage VCB generated by the voltage divider 300A can be calculated as:

$$VCB = VPP \times \frac{R1}{R1+R2}.$$

In another embodiment, the cascoded bias voltage VCB shown in FIG. 2A can be generated by the voltage divider 300B shown in FIG. 3B. The voltage divider 300B includes a plurality of diodes 302, each of which may be implemented using a diode-connected transistor. There are N2 diodes in the upper portion of the voltage divider 300B, and N1 diodes in the lower portion of the voltage divider 300B. Thus, the cascoded bias voltage VCB generated by the voltage divider 300B can be calculated as:

$$VCB = VPP \times \frac{N1}{N1+N2}.$$

Figure 4A:
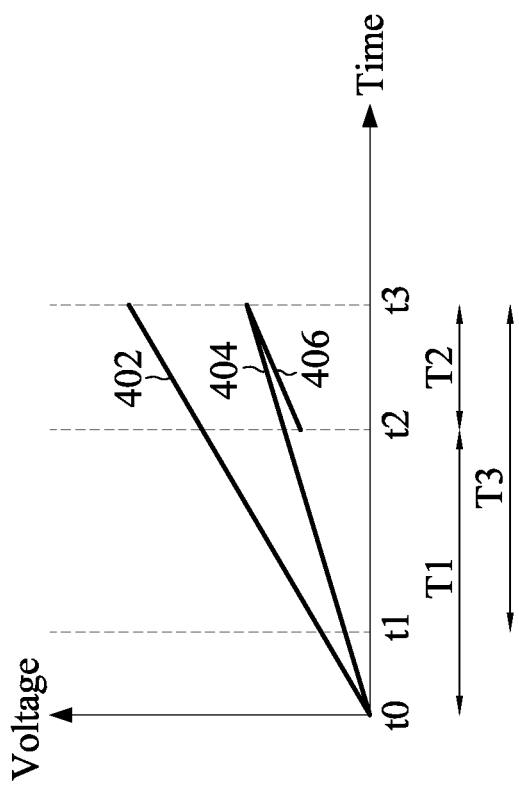
FIGS. 4A and 4B are diagrams illustrating the operating ranges of the cascoded bias voltage VCB generated by the voltage dividers 300A and 300B in FIGS. 3A-3B.
Figure 4B:
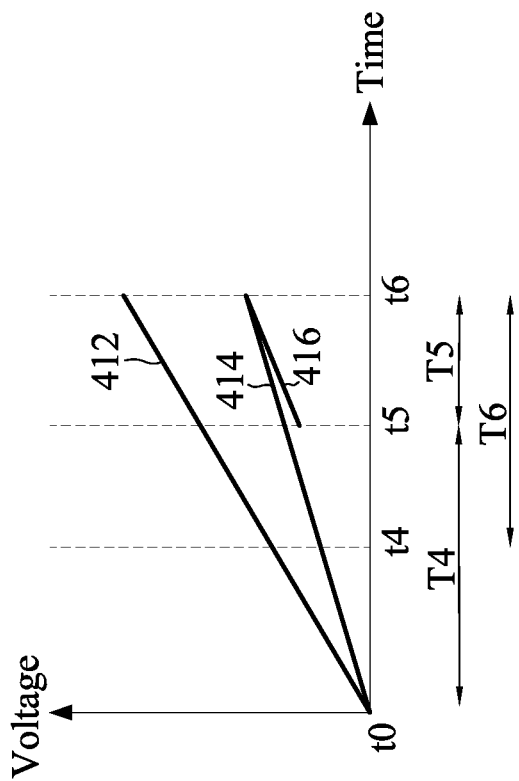

FIGS. 4A and 4B are diagrams illustrating the operating ranges of the cascoded bias voltage VCB generated by the voltage dividers 300A and 300B in FIGS. 3A-3B.

In some embodiments, the operating ranges of the cascoded bias voltage VCB generated by the voltage dividers 300A and 300B shown in FIG. 4A are for the P-type transistors of the level shifter 200 shown in FIG. 2A. Referring to FIG. 4A, curve 402 shows the power supply voltage VPP over time. Curve 404 shows the cascoded bias voltage VCB generated by the voltage divider 300A, and curve 406 shows the cascoded bias voltage VCB generated by the voltage divider 300B. For example, the cascoded bias voltage VCB generated by the voltage divider 300A can be a ratio (e.g., (R1/(R1+R2)) of the power supply voltage VPP. At time t1, the cascoded bias voltage VCB is lower than the power supply voltage VPP by the threshold voltage of the P-type transistors M3 and M4, and the P-type transistors M3 and M4 are turned on. Thus, the P-type transistors M3 and M4 can work normally in the time interval T3 (e.g., from time t1 to time t3). The output terminal of the voltage divider 300B is floating (e.g., time interval T1 from time t0 to time t2) until the power supply voltage VPP is higher than the (N1+N2)*VD at time t2 (e.g., the diodes 302 are turned on), where VD denotes the threshold voltage of the diodes 302. At time t2, the cascoded bias voltage VCB is lower than the power supply voltage VPP, and the P-type transistors M3 and M4 are turned on. Thus, the P-type transistors M3 and M4 can work normally in the time interval T2 (e.g., from time t2 to time t3).

Referring to FIG. 4B, curve 412 shows the power supply voltage VPP over time. Curve 414 shows the cascoded bias voltage VCB generated by the voltage divider 300A, and curve 416 shows the cascoded bias voltage VCB generated by the voltage divider 300B. For example, the cascoded bias voltage VCB generated by the voltage divider 300A can be a ratio (e.g., (R1/(R1+R2)) of the power supply voltage VPP. At time t4, the cascoded bias voltage VCB is higher than the threshold voltage of the N-type transistors M5 and M6, and the N-type transistors M5 and M6 are turned on. Thus, the N-type transistors M5 and M6 can work normally in the time interval T6 (e.g., from time t4 to time t6). The output terminal of the voltage divider 300B is floating (e.g., time interval T4 from time t0 to time t5) until the power supply voltage VPP is higher than the (N1+N2)*VD at time t5 (e.g., the diodes 302 are turned on), where VD denotes the threshold voltage of the diodes 302. At time t5, the cascoded bias voltage VCB is higher than the threshold voltage of the N-type transistors M5 and M6, and the N-type transistors M5 and M6 are turned on. Thus, the N-type transistors M5 and M6 can work normally in the time interval T5 (e.g., from time t5 to time t6).

Figure 5A:
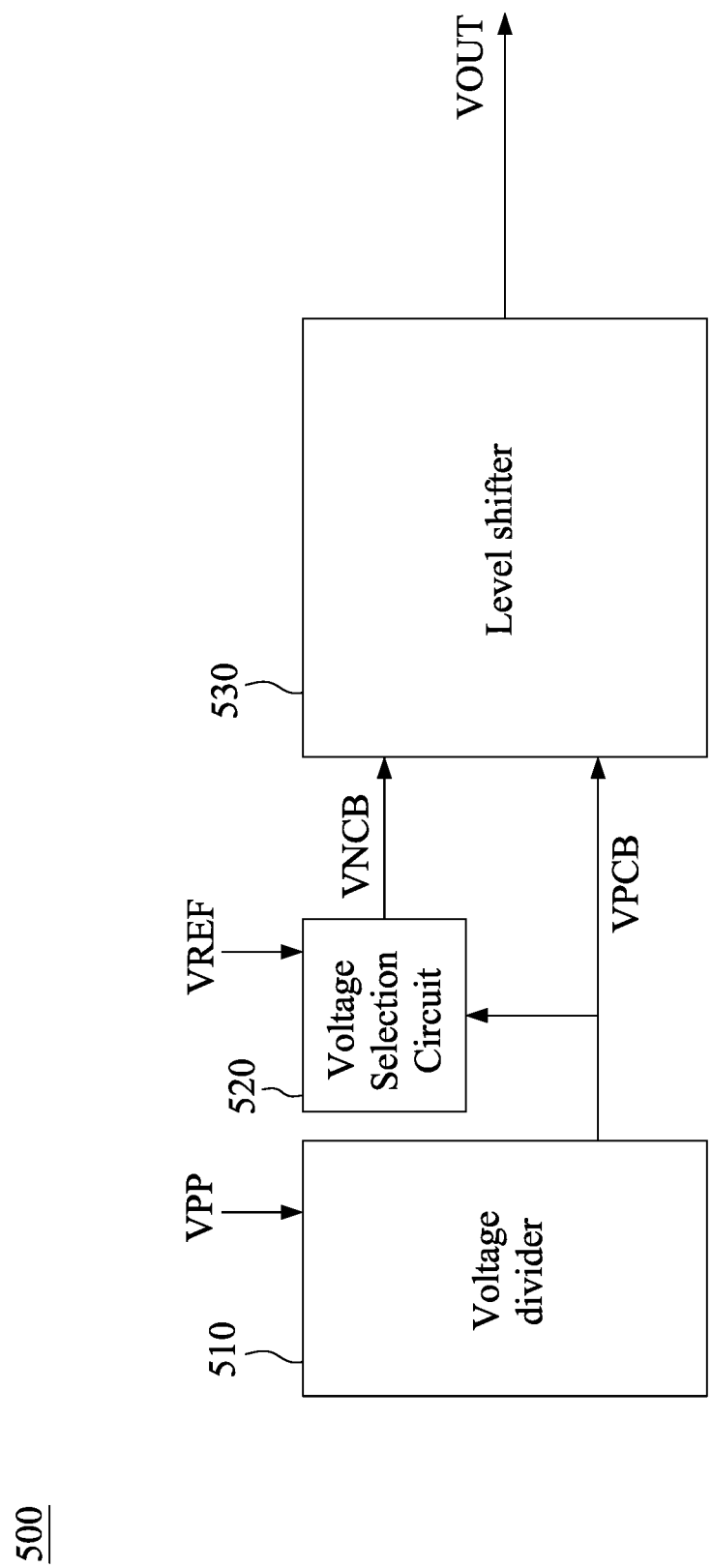
FIG. 5A is a block diagram of a bias voltage generator 500 in accordance with an embodiment of the present disclosure.
Figure 5B:
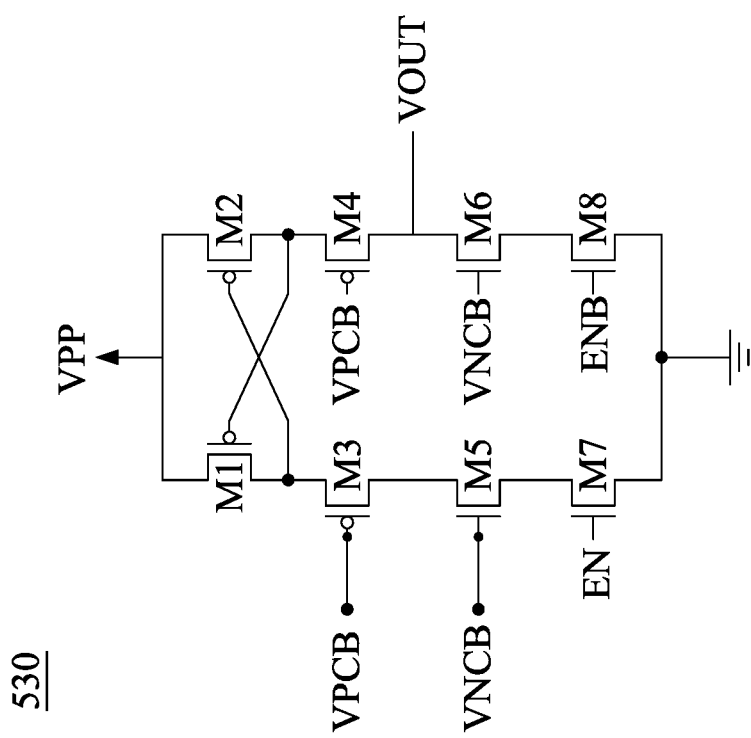
FIG. 5B is a schematic diagram of the level shifter 530 in the bias voltage generator 500 of FIG. 5A.

FIG. 5A is a block diagram of a bias voltage generator 500 in accordance with an embodiment of the present disclosure. FIG. 5B is a schematic diagram of the level shifter 530 in the bias voltage generator 500 of FIG. 5A.

In an embodiment, the bias voltage generator 500 includes a voltage divider 510, a voltage selection circuit 520, and a level shifter 530, as shown in FIG. 5A. The voltage divider 510 may be configured to generate a cascoded bias voltage VPCB (e.g., for P-type transistors M3 and M4 of the level shifter 530) from the power supply voltage VPP, where the cascoded bias voltage VPCB is lower than the power supply voltage VPP. The voltage selection circuit 520 is configured to select the maximum between the cascoded bias voltage VPCB and a reference voltage VREF to generate a cascoded bias voltage VNCB (e.g., for N-type transistor M5 and M6 of the level shifter 530).

The architecture of the level shifter 530 shown in FIG. 5B may be similar to that of the level shifter 200 shown in FIG. 2A, with the difference therebetween that the P-type transistors M3 and M4 of the level shifter 530 are provided with the cascoded bias voltage VPCB, and the N-type transistors M5 and M6 of the level shifter 530 are provided with the cascoded bias voltage VNCB.

Figure 6B:
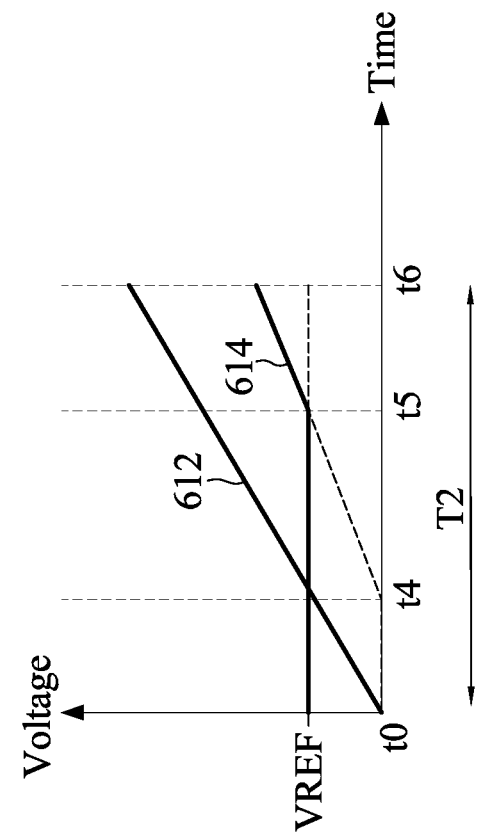
FIGS. 6A and 6B are waveform diagrams of the cascoded bias voltages VPCB and VNCB in the bias voltage generator 500.
Figure 6A:
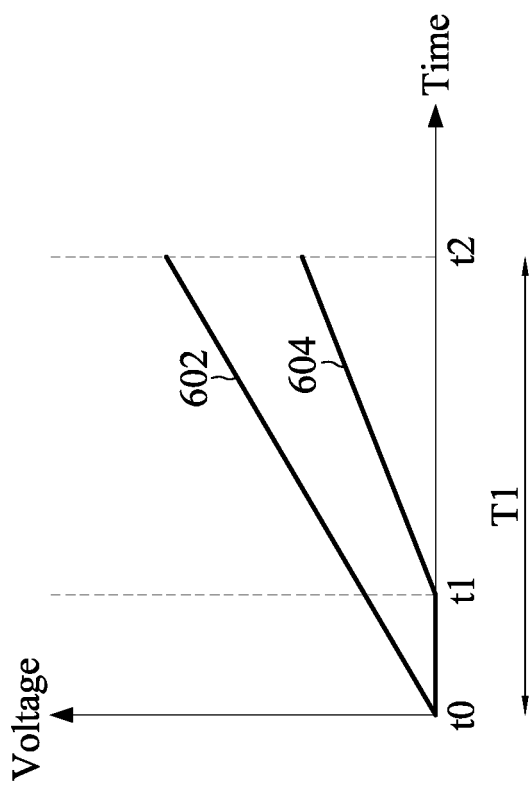

More specifically, the voltage divider 510 may be a voltage divider with a low quiescent current and level-aware ratio control to provide a cascoded bias voltage VPCB for the P-type transistors M3 and M4 of the level shifter 530 so that the level shifter 530 or a subsequent power switch (not shown in FIG. 5A) can operate in a wider voltage operating range shown in FIG. 6A even if no power supply voltage VPP is provided. Referring to FIG. 6A, curve 602 illustrates the power supply voltage VPP over time, and curve 604 illustrates the cascoded bias voltage VPCB over time. At time t0, the power supply voltage VPP is equal to 0V, and the cascoded bias voltage VPCB output by the voltage divider 510 will be tied to the ground (e.g., 0V). At time t1, the power supply voltage VPP has been pumped up to a certain voltage level, and the cascoded bias voltage VPCB output by the voltage divider 510 will increase as the power supply voltage VPP, as shown in FIG. 6A. Thus, the cascoded bias voltage VPCB is valid (i.e., non-floating) in the time interval T1 from time t0 to time t2 to achieve a wider voltage operating range. The details of the voltage divider 510 will be described in the embodiments FIGS. 7 to 11.

In some embodiments, the voltage selection circuit 520 may provide a cascoded bias voltage VNCB for the N-type transistors M5 and M6 of the level shifter 530 so that the level shifter 530 or a subsequent power switch (not shown in FIG. 5A) can operate in a wider voltage operating range shown in FIG. 6B even if no power supply voltage VPP is provided. Referring to FIG. 6B, curve 612 illustrates the power supply voltage VPP over time, and curve 614 illustrates the cascoded bias voltage VNCB over time. At time t0, the power supply voltage VPP is equal to 0V, and the cascoded bias voltage VNCB output by voltage selection circuit 520 will be equal to the reference voltage VREF. At time t4, the power supply voltage VPP has been pumped up to a similar voltage level at time t1 shown in FIG. 6A, the cascoded bias voltage VNCB output by the voltage selection circuit 520 is still maintained at the reference voltage VREF until time t5, as shown in FIG. 6B. At time t5, the cascoded bias voltage VN CB output by the voltage selection circuit 520 will increase as the power supply voltage VPP. Thus, the cascoded bias voltage VNCB is valid (i.e., non-floating) in the time interval T2 from time t0 to time t6 to achieve a wider voltage operating range. The details of the voltage selection circuit are provided in the embodiments of FIGS. 12A to 12D.

Figure 7A:
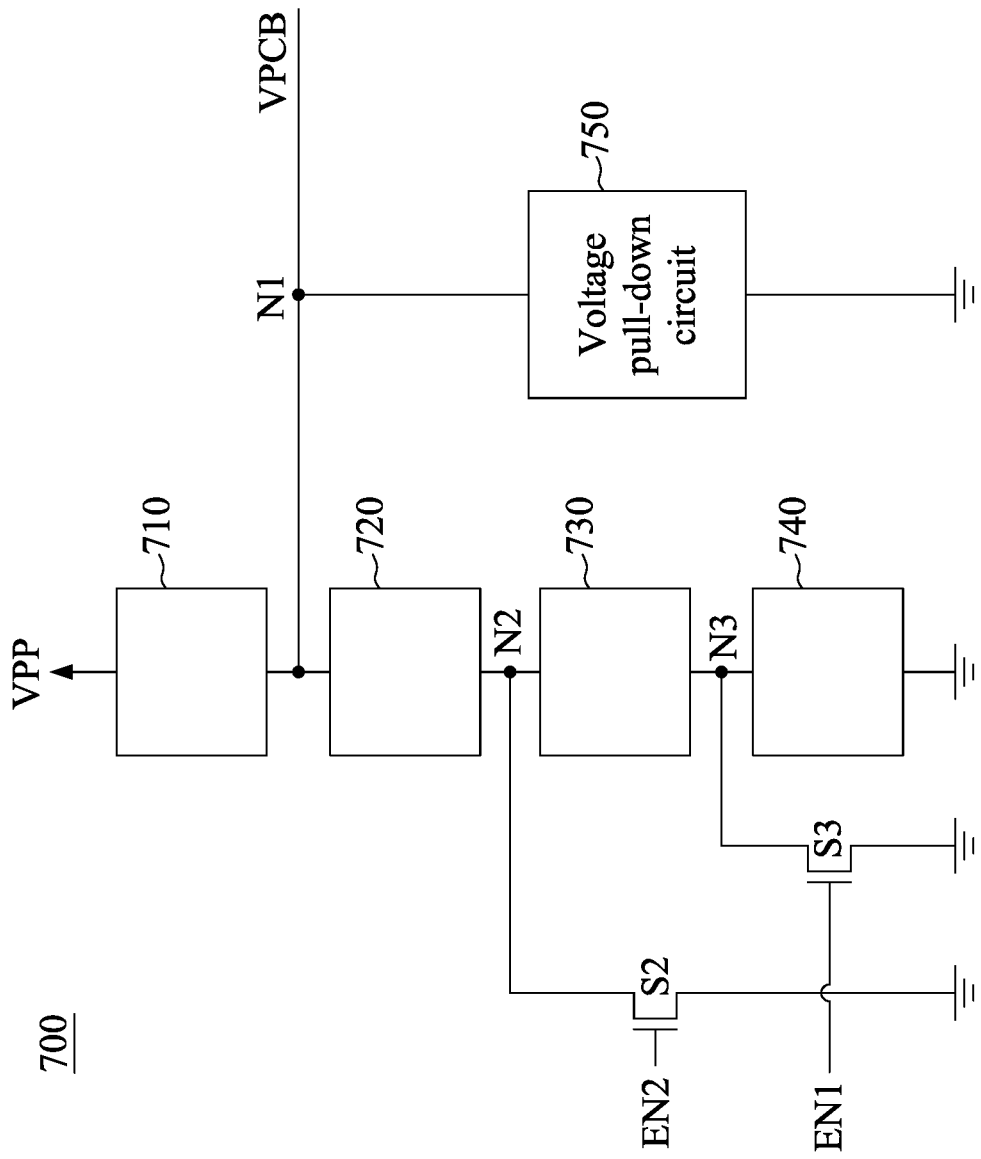
FIG. 7A is a block diagram of a level shifter 700 in accordance with an embodiment of the present disclosure.
Figure 7B:
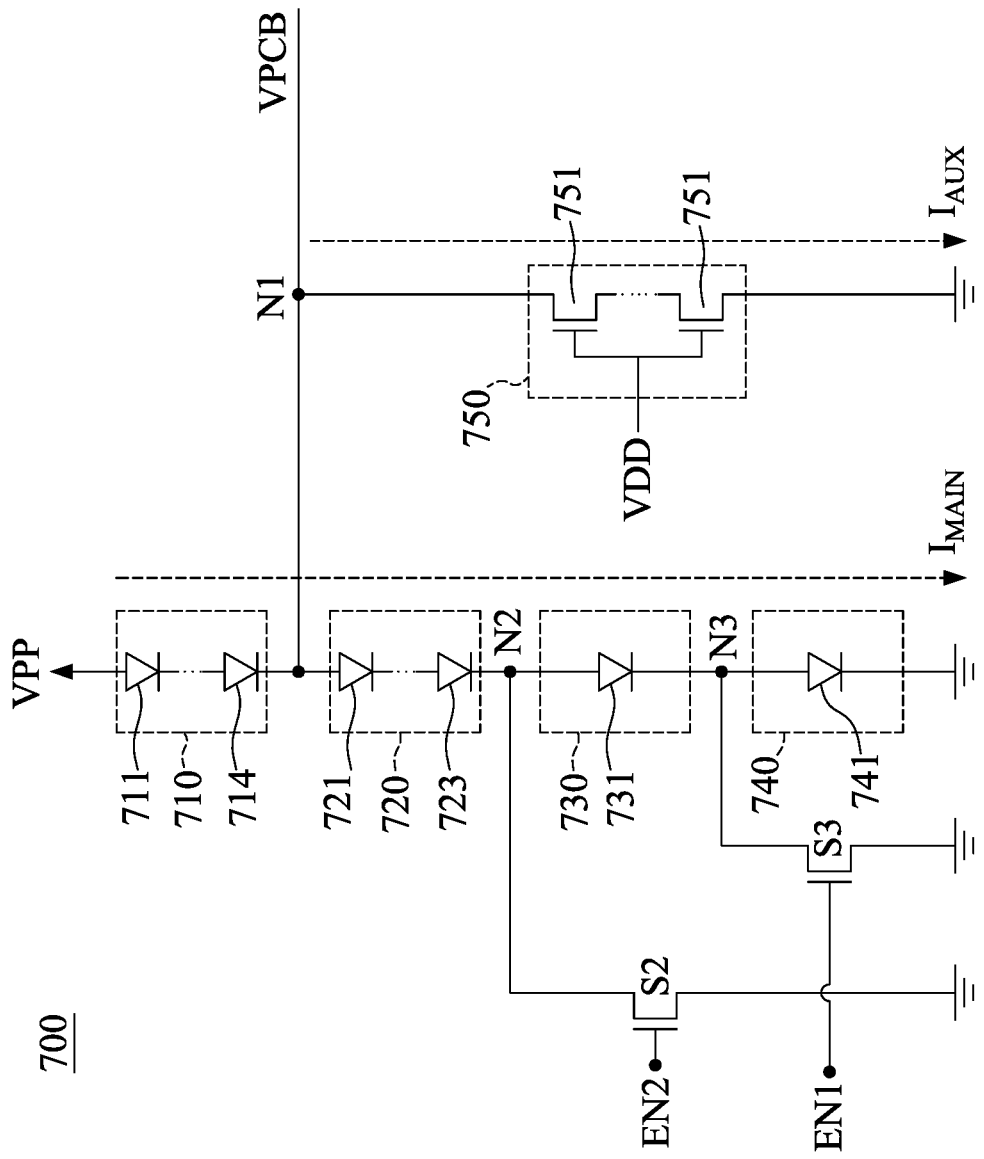
FIG. 7B is a schematic diagram of the level shifter 700 of FIG. 7A.
Figures 7C, 7D:
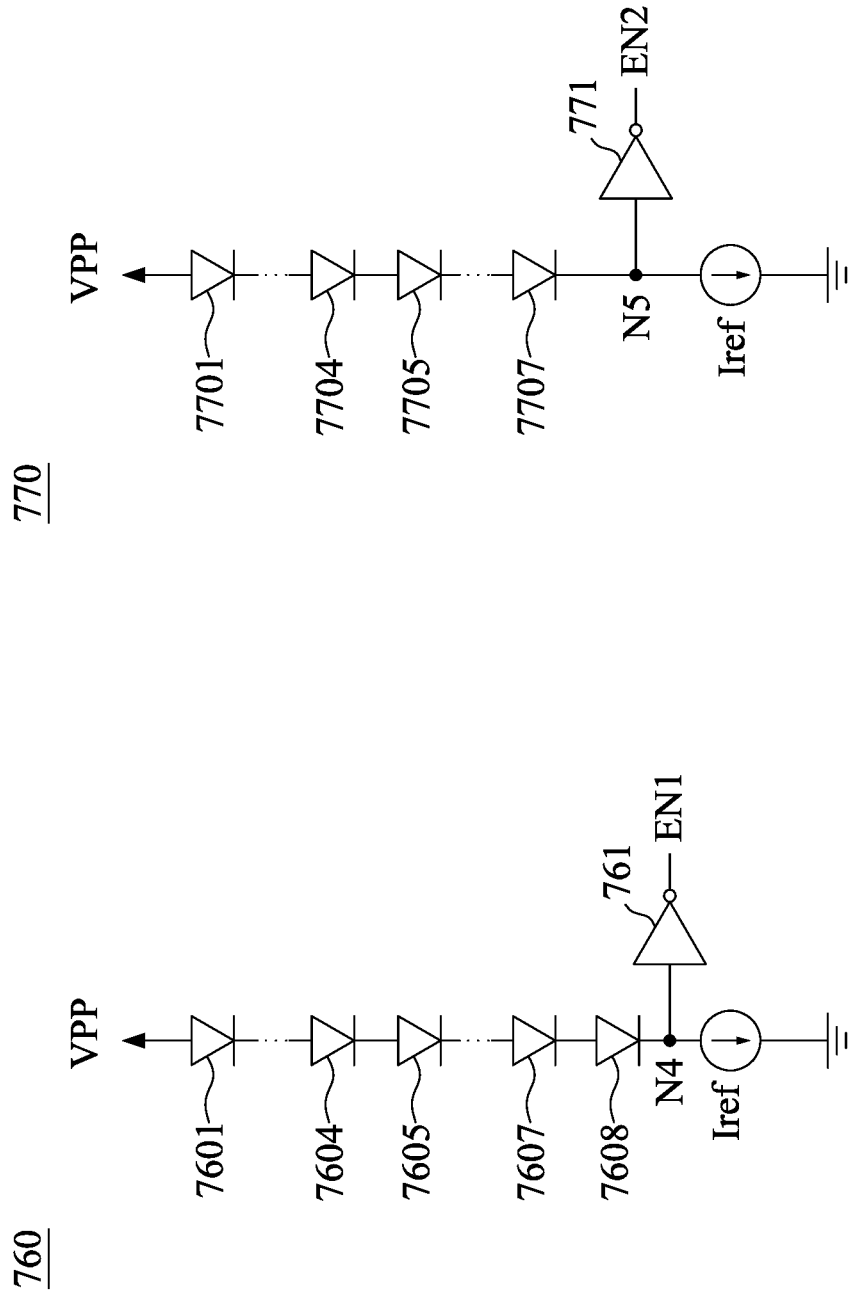
FIGS. 7C and 7D are schematic diagrams illustrating level detectors in the level shifter 700 of FIG. 7A.

FIG. 7A is a block diagram of a level shifter 700 in accordance with an embodiment of the present disclosure. FIG. 7B is a schematic diagram of the level shifter 700 of FIG. 7A. FIGS. 7C and 7D are schematic diagrams illustrating level detectors in the level shifter 700 of FIG. 7A.

In some embodiments, the voltage divider 510 shown in FIG. 5A can be implemented using the level shifter 700 shown in FIG. 7A. As depicted in FIG. 7A, the level shifter 700 includes stages 710, 720, 730, and 740, a voltage pull-down circuit 750, and switches S2 and S3. Stage 710 is coupled between the power supply voltage VPP and node N1. Stage 720 is coupled between node N1 and node N2. Stage 730 is coupled between node N2 and node N3. Stage 740 is coupled between node N3 and the ground. The switch S2, coupled between node N2 and the ground, is controlled by a level-control signal EN2. The switch S3, coupled between node N3 and the ground, is controlled by another level-control signal EN.

In some embodiments, each of stages 710, 720, 730, and 740 may be implemented by a diode chain including one or more diodes connected in series. For purposes of description, it is assumed that stage 710 includes four diodes 711 to 714, stage 720 includes three diodes 721 to 723, stage 730 includes one diode 731, and stage 740 includes one diode 741, as shown in FIG. 7B. The diodes 711 to 714, 721 to 723, 731, and 741 may have similar threshold voltages since they are fabricated using the same manufacturing process. In some embodiments, the diodes 711 to 714, 721 to 723, 731, and 741 may have a high threshold voltage (e.g., 0.5V to 0.7V), and can be implemented using diode-connected transistors. In some embodiments, the diodes in each of stages 710, 720, 730, and 740 can be replaced by more diodes with an ultra low threshold voltage (Ulvt) connected in series to increase the resolution of the level shifter 700.

When the diode chain formed by all or a portion of stages 710, 720, 730, and 740 is enabled, the voltage level of the cascoded bias voltage VPCB output by the level shifter 700 can be adjusted by the voltage pull-down paths controlled by the switches S2 and S3. For example, when the power supply voltage VPP is higher than VD*N, the diode chain is enabled, where N denotes the number of diodes in the diode chain, and VD denotes the threshold voltage of each diode in the diode chain. It should be noted that two voltage pull-down paths are shown in FIG. 7B for purposes of description, and level shifter 700 can have N voltage pull-down paths depending on need.

In some embodiments, given that the level-control signals EN2 and EN1 are in the low logic state, the switches S2 and S3 are turned off, and there are 9 diodes in the diode chain (e.g., stages 710, 720, 730, and 740). The cascoded bias voltage VPCB is approximately equal to (5/9)*VPP (i.e., 4 diodes in stage 710, and 5 diodes in stages 720, 730, and 740). Given that the level-control signals EN2 and EN1 are in the high logic state, the switches S2 and S3 are turned on, and there are 7 diodes in the diode chain (e.g., 4 diodes in stage 710 and 3 diodes in stage 720). The cascoded bias voltage VPCB is approximately equal to (3/7)*VPP.

Given that the level-control signals EN2 and EN1 are respectively in the low logic state and the high logic state, the switch S2 is turned off and the switch S3 is turned on, and there are 8 diodes in the diode chain (e.g., 4 diodes in stage 710, 3 diodes in stage 720, and 1 diode in stage 730). The cascoded bias voltage VPCB is approximately equal to (1/2)*VPP.

In some embodiments, when the diode chain in the level shifter 700 is not yet enabled, the voltage pull-down circuit 750 may be configured to initialize the cascoded bias voltage VPCB output by the level shifter 700 when the power supply voltage VPP is in a relatively low voltage level (e.g., <2.5V) or floating (e.g., the diode chain is not yet enabled). The voltage pull-down circuit 750 may include a plurality of transistors 751. The transistors 751 are turned on since a power supply voltage VDD is applied to the transistors 751, and the cascoded bias voltage VPCB is pulled down to the ground (e.g., 0V). It should be noted that the auxiliary current $I_{AUX}$ from node N1 to the ground through the switches 751 is much lower than the current $I_{MAIN}$ (i.e., $I_{AUX} \ll I_{MAIN}$) when the diode chain in the level shifter 700 is enabled. When the diode chain in the level shifter 700 is enabled, the auxiliary current $I_{AUX}$ can be neglected, and the current $I_{MAIN}$ will be the dominant current for determining the voltage level of the cascoded bias voltage VPCB.

In some embodiments, the transistors 751 can be implemented with a resistor when no suitable gate bias control circuit is implemented. In some embodiments, the level-control signals EN1 and EN2 may be from an external controller. In some embodiments, the transistors 751 in the voltage pull-down circuit 750 can be implemented using a super power rail (SPR) architecture. With the SPR architecture, the transistors 751 can share the power supply voltage VDD on the same power rail, and the overall area of the transistors 751 can be reduced.

In some embodiments, the level-control signals EN1 and EN2 may be generated by the level detectors 760 and 770 shown in FIGS. 7C and 7D, respectively. The level detectors 760 and 770 may be configured to track the voltage ratio of the cascoded bias voltage VPCB. The number of diodes of the level detector 760 may be equal to the total number of diodes in stages 710, 720, and 730. The number of diodes of the level detector 770 may be equal to the total number of diodes in stages 710 and 720.

For purposes of description, the level detector 760 may include diodes 7601 to 7608 and an inverter 761. The diodes 7601 and 7608 may form a diode chain coupled between the power supply voltage VPP and node N4. In addition, a current source providing a reference current $I_{ref}$ is coupled between node N4 and the ground. The current source can be implemented by a resistor, a transistor or any other suitable current generating circuits, but the present disclosure is not limited thereto.

In some embodiments, the level detector 770 may include diodes 7701 to 7607 and an inverter 771. The diodes 7701 and 7707 may form another diode chain coupled between the power supply voltage VPP and node N5. In addition, a current source providing a reference current $I_{ref}$ is coupled between node N5 and the ground. The current source can be implemented by a resistor, a transistor, or any other suitable current generating circuit, but the present disclosure is not limited thereto.

For purposes of description, there are 8 and 7 diodes in the level detectors 760 and 770, respectively. The difference of the numbers of diodes between the level detectors 760 and 770 can be used to detect the voltage level of the power supply voltage VPP to control the level-control signals EN1 and EN2, thereby adjusting the number of diodes in the diode chain in the level shifter 700. It should be noted that the threshold voltage of the diodes 7601 to 7608 and 7701 to 7701 may be similar to that of the diodes 711 to 714 and 721 to 723 of the level shifter 700 shown in FIG. 7B so as to detect the voltage level of the power supply voltage VPP.

In some embodiments, when the power supply voltage VPP gradually increases to a first voltage level of 7*VD, the diode chain (e.g., including diodes 7701 to 7707) in the level detector 770 is enabled, but the diode chain (e.g., including diodes 7601 to 7608) in the level detector 760 is not yet enabled. At this time, node N5 is in the low logic state (e.g., 0V), and the level-control signal EN2 output by the inverter 771 will be in the high logic state. In addition, the voltage at node N4 is pulled down to the ground (e.g., 0V) through the current source, and the level-control signal EN1 output by the inverter 761 will also be in the high logic state. Afterwards, the power supply voltage VPP gradually increases to a second voltage level such that the voltage level at node N5 exceeds the minimal input high level (e.g., $V_{IH}$) of the inverter 771, and the level-control signal EN2 output by the inverter 771 will be in the low logic state so that the voltage pull-down path from node N2 to the ground is disabled. In brief, when the power supply voltage VPP is in a low voltage range, the voltage pull-down path from node N2 to the ground is enabled, and stages 730 and 740 are not in the diode chain of the level shifter 700. When the power supply voltage VPP is sufficiently high, the voltage pull-down path from node N2 to the ground is disabled.

In some embodiments, the operations of the level detector 760 are similar to those of the level detector 770, with the difference therebetween that there are 8 diodes 7601 to 7608 in the level detector 760. When the power supply voltage VPP is in a low voltage range, the voltage pull-down path from node N3 to the ground is enabled, and stage 740 is not in the diode chain of the level shifter 700. When the power supply voltage VPP is sufficiently high, the voltage pull-down path from node N3 to the ground is disabled, and stage 740 will be in the diode chain of the level shifter 700 if the switch S2 is not turned on (e.g., EN2=0).

In some embodiments, the current source providing the reference current Iref can be implemented by long-channel transistors with a bias voltage. In some embodiments, the level-control signal EN1 and EN2 may be from an external control circuit (not shown). In some embodiments, the inverter 761 and 771 can be replaced by comparators (not shown) with a reference voltage VREF. For example, when the voltage at node N5 is higher than or equal to the reference voltage VREF, the level-control signal EN2 is in the low logic state. When the voltage at node N5 is lower than the reference voltage VREF, the level-control signal EN2 is in the high logic state. Similarly, when the voltage at node N4 is higher than or equal to the reference voltage VREF, the level-control signal EN1 is in the low logic state. When the voltage at node N4 is lower than the reference voltage VREF, the level-control signal EN1 is in the high logic state.

Figure 8A:
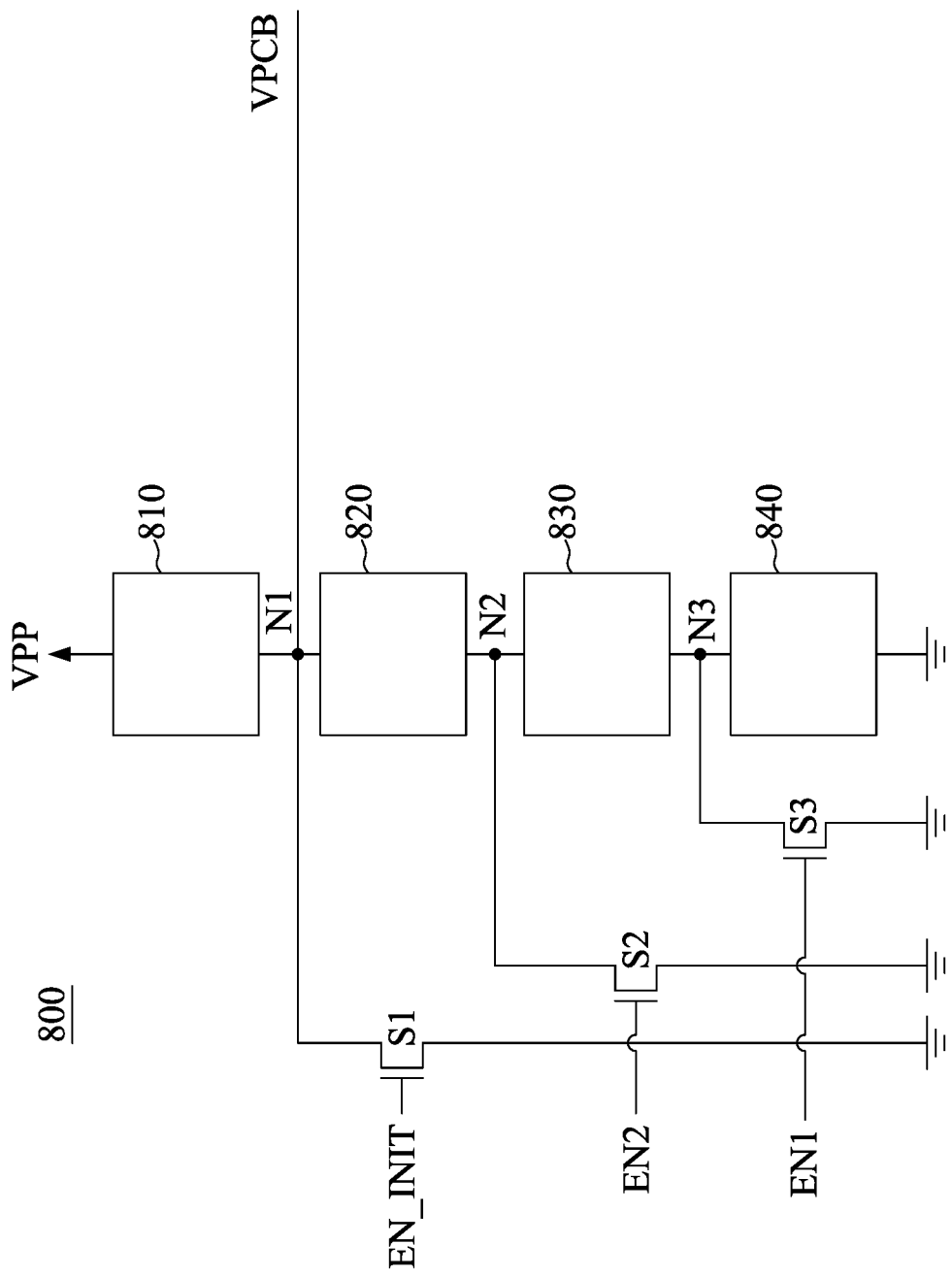
FIG. 8A is a block diagram of a voltage divider 800 in accordance with an embodiment of the present disclosure.
Figure 8B:
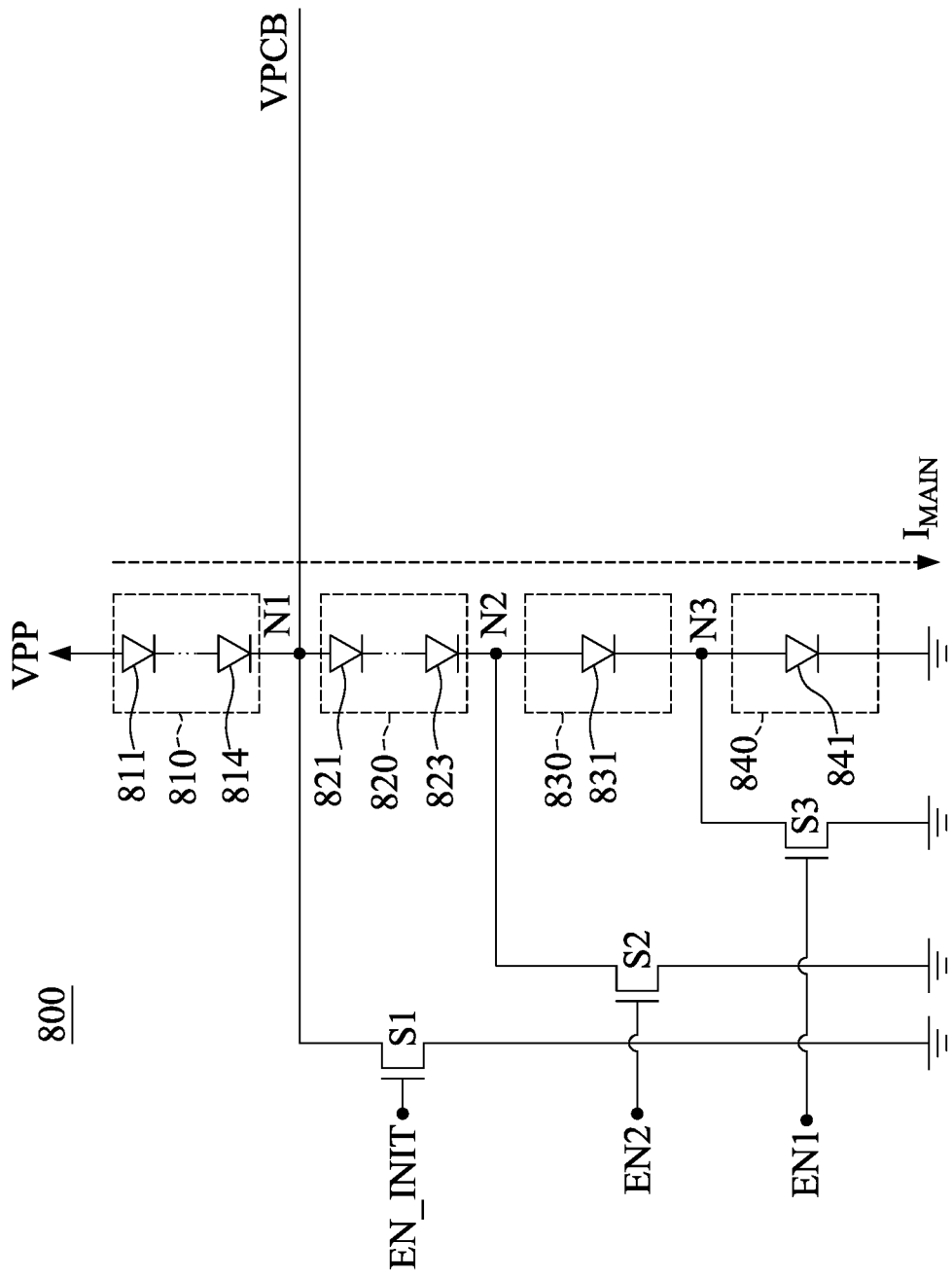
FIG. 8B is a schematic diagram of the voltage divider 800 of FIG. 8A.

FIG. 8A is a block diagram of a voltage divider 800 in accordance with an embodiment of the present disclosure. FIG. 8B is a schematic diagram of the voltage divider 800 of FIG. 8A. FIGS. 8C to 8E are schematic diagrams illustrating level detectors in the voltage divider 800 of FIG. 8A.

In some embodiments, the voltage divider 800 shown in FIG. 8A is similar to the level shifter 700 shown in FIG. 7A, with the difference therebetween that the voltage divider 800 includes a voltage pull-down path from node N1 to the ground to replace the voltage pull-down circuit 750 in the level shifter 700. In addition, the level detectors 860 and 870 shown in FIGS. 8C and 8D are similar to the level detector 760 and 770 shown in FIGS. 7C and 7D, the details of which are not repeated here.

In some embodiments, when the switch S1 is turned on, the voltage pull-down path from node N1 to the ground is enabled, and cascoded bias voltage VPCB at node N1 will be pulled down to the ground (e.g., 0V). The switch S1 is controlled by a level-initialization signal EN_INIT generated by the level detector 880 shown in FIG. 8E.

In some embodiments, the number of diodes in the level detector 880 may be equal to the number of diodes in stage 810. For purposes of description, the level detector 880 may include diodes 8801 to 8804 and a transistor Q1 connected in series, as shown in FIG. 8E. The transistor Q1 is controlled by a power supply voltage Vddq (e.g., 1.2V or 1.35V). When the power supply voltage VPP is lower than 4*VD, the diodes 8801 to 8804 are not turned on, and the voltage at node N6 will be (Vddq-Vt), where Vt is the threshold voltage of the transistor Q1. Since the voltage (Vddq-Vt) is below the maximum input low level ($V_{IL}$) of the inverter 881, the level-initialization signal EN_INIT output by the inverter 881 is in the high logic state, and the cascoded bias voltage VPCB is pulled down to the ground through the voltage pull-down path from node N1 to the ground.

When the power supply voltage VPP is sufficiently high (e.g., ≥4*VD), the diodes 8801 to 8804 are turned on, and the voltage at node N6 will be equal to VPP-4*VD. At this time, the voltage (VPP-4*VD) is higher than the minimal input high level ($V_{IH}$) of the inverter 881, the level-initialization signal EN_INIT output by the inverter 881 is in the low logic state, and the voltage pull-down path from node N1 to the ground is disabled. Thus, the voltage level of the cascoded bias voltage VPCB is determined by the ratio of the number of diodes in the lower portion (e.g., stage 820 plus activated stages 830 and/or 840) to the total number of diodes in the diode chain of the voltage divider 800.

Figure 9A:
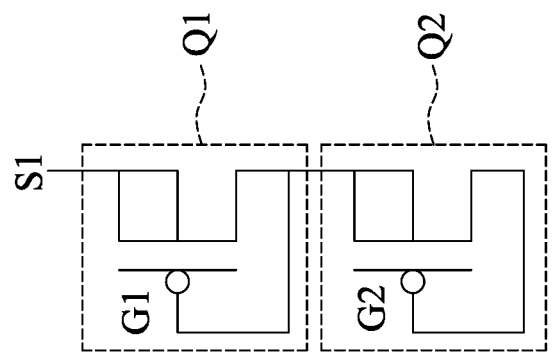
FIG. 9A is a schematic diagram of a cascoded diode chain in accordance with an embodiment of the present disclosure.
Figure 9B:
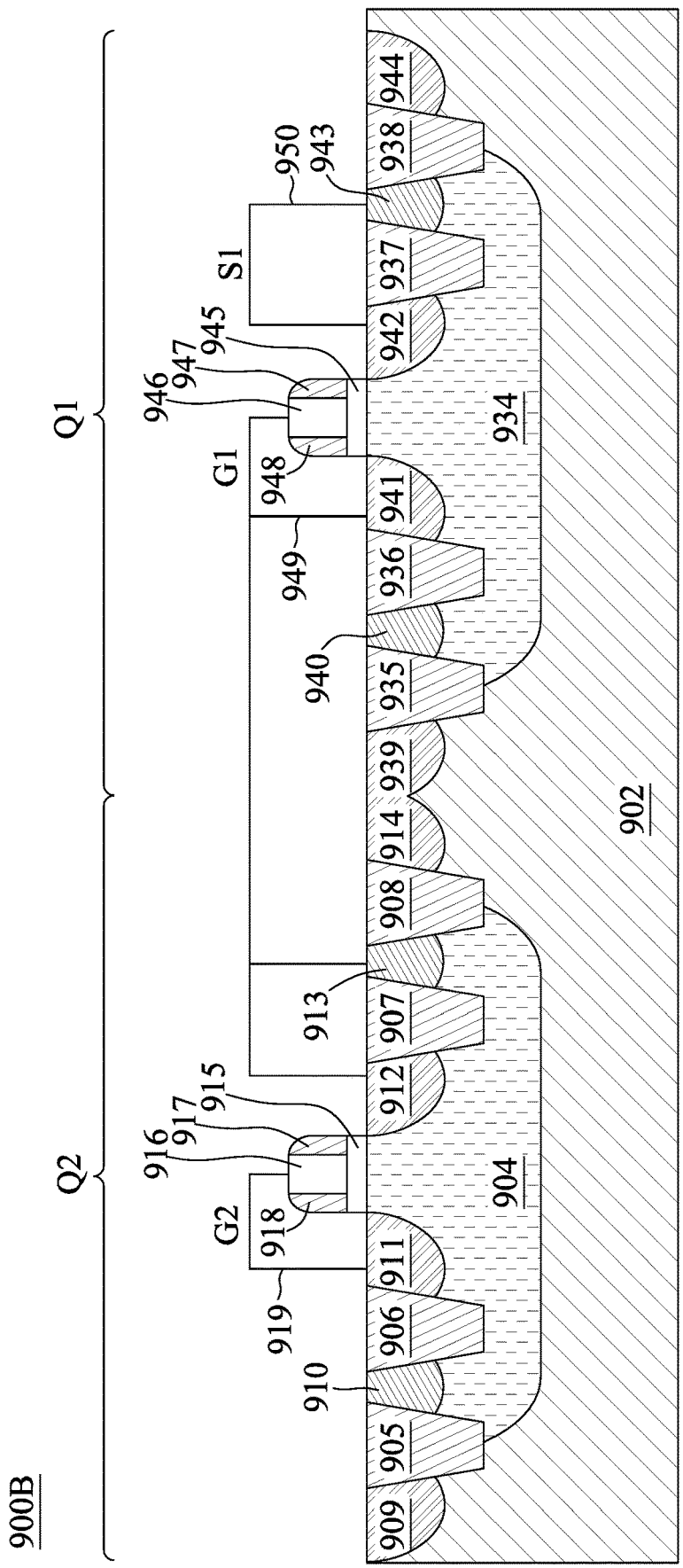
FIG. 9B is a cross section of the cascoded diode chain of FIG. 9A.

FIG. 9A is a schematic diagram of a cascoded diode chain in accordance with an embodiment of the present disclosure. FIG. 9B is a cross section of the cascoded diode chain of FIG. 9A.

In some embodiments, the diode chains in the voltage dividers 700 and 800 and level detectors 760, 770, 860, 870, and 880 can be implemented using a cascoded diode chain 900A shown in FIG. 9A to achieve a low quiescent current. For brevity, two P-type transistors Q1 and Q2 with a diode-connected configuration are shown in FIG. 9A. In some embodiments, the transistors Q1 and Q2 are I/O devices with 1.2V voltage stress. In some embodiments, the transistors Q1 and Q2 are core devices with 1.2V voltage stress (e.g., for 2 nm process). The gate oxide of the core devices may be thinner than that of the I/O devices under the same process.

In some embodiments, the P-type transistors Q1 and Q2 are fabricated using separated N-wells, as shown in FIG. 9B. For example, the semiconductor structure 900B may include a substrate 902 (e.g., a P-type substrate). The transistors Q1 and Q2 are formed on a substrate 902, and N-wells 904 and 934 are formed on the substrate 902. Regions 909, 911, 912, 914, 939, 941, 942, 944 may refer to P-type doped (P+) regions. Regions 910, 913, 940, and 943 may refer to N-type doped (N+) regions. Regions 905 to 908 and 935 to 938 may refer to shallow trench isolation (STI) regions. Gate oxides 915 and 945 may be formed on the N-wells 904 and 934, respectively. Gate metals 916 and 946 may be formed on the gate oxides 915 and 945 respectively. The gate spacers 917 and 918 may be formed on sidewalls of the gate metal 916. The gate spacers 947 and 948 may be formed on sidewalls of the gate metal 946.

Specifically, the source S1 (e.g., region 942) of the transistor Q1 is electrically connected to the body (e.g., region 943) of the transistor Q1 through metal wire 950. The source (e.g., region 912) of the transistor Q2 is electrically connected to the body (e.g., region 913) of the transistor Q2, and the gate (e.g., gate metal 946) and drain (e.g., region 941) of the transistor Q1 through metal wire 949. Since the transistors Q1 and Q2 have respective bodies (e.g., N-wells 904 and 934), the source of the transistor Q2 can be electrically connected to the respective body (e.g., N-well 904) so as to mitigate the voltage stress between the source and body of the transistor Q2.

Figure 9C:
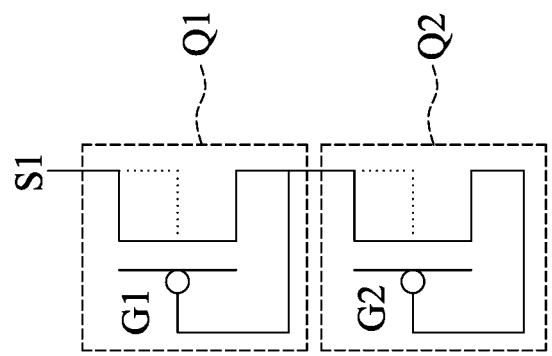
FIG. 9C is a schematic diagram of a cascoded diode chain in accordance with another embodiment of the present disclosure.
Figure 9D:
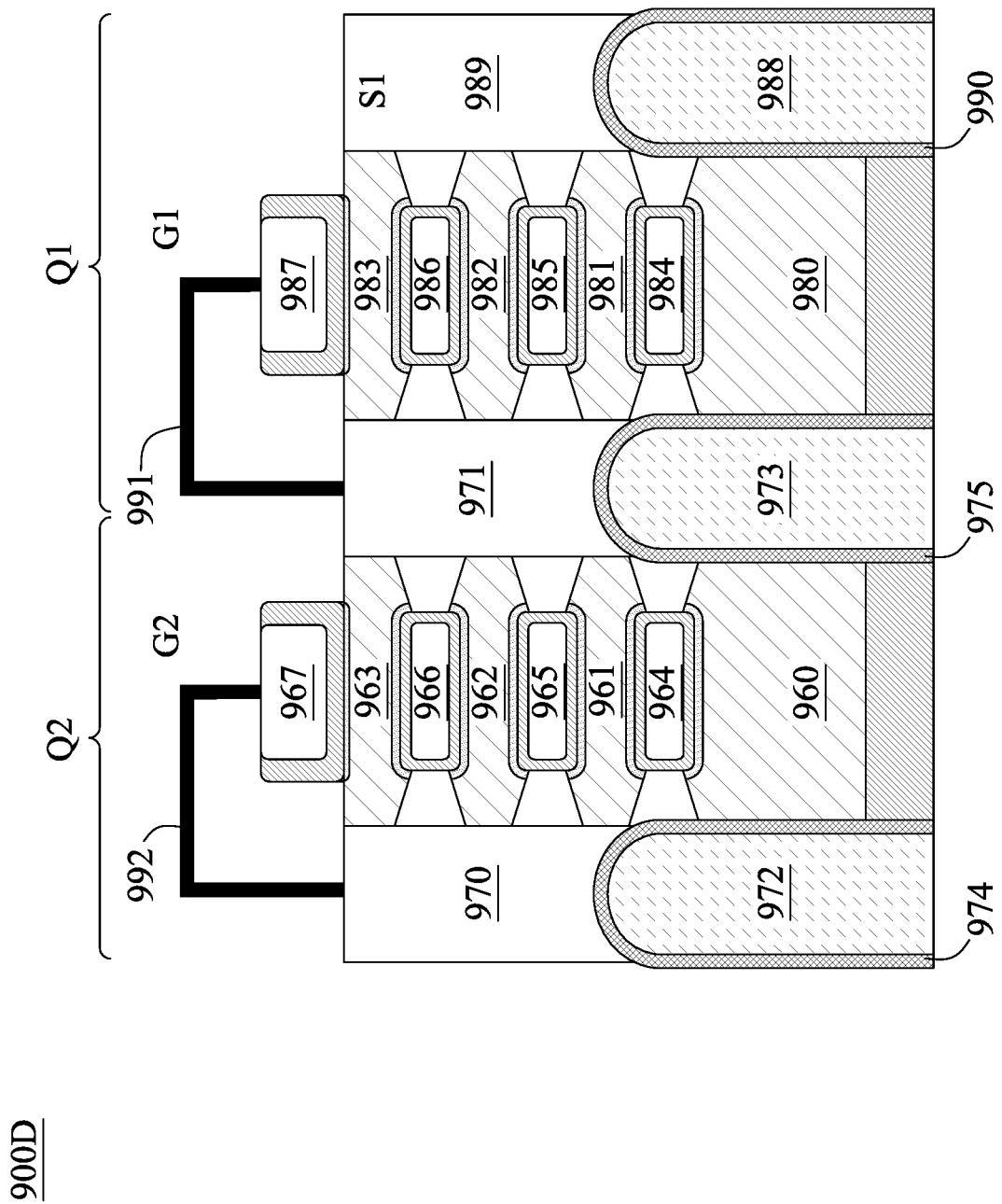
FIG. 9D is a cross section of the cascoded diode chain of FIG. 9C.

FIG. 9C is a schematic diagram of a cascoded diode chain in accordance with another embodiment of the present disclosure. FIG. 9D is a cross section of the cascoded diode chain of FIG. 9C.

In some embodiments, the diode chains in the level shifters 700 and 800 and level detectors 760, 770, 860, 870, and 880 can be implemented using cascoded diode chain 900C in FIG. 9C to achieve a low quiescent current. For brevity, two P-type transistors Q1 and Q2 with a diode-connected configuration are shown in FIG. 9C. The transistors Q1 and Q2 are fabricated using a super power rail structure as shown by the semiconductor structure 900D in FIG. 9D.

In some embodiments, the semiconductor structure 900D includes N-type epitaxial layers (NEPI) 970, 971, and 989, metal gates 964 to 967 and 984 to 987, floating regions 960 to 963 and 980 to 983, shallow trench isolation (STI) regions 974, 975, and 990. The transistors Q1 and Q2 may share the NEPI 971, which is the drain of the transistor Q1 and the source of the transistor Q2. The regions 960 and 980 may include respective substrates as bodies of the transistor Q2 and Q1, respectively. The metal gates 964 to 967 may be surrounded by corresponding isolation layers, as shown in FIG. 9D. The regions 972, 973, and 988 may refer to body vias (VB) that are electrically connected to other elements on the same semiconductor wafer (not shown).

The regions 960 to 963 and 980 to 983 may be regarded as floating regions. For example, the body (i.e., region 960) of the transistor Q2 is fully isolated by the isolation layer of the metal gate 964, and the STI regions 974 and 975. Accordingly, the source of the transistor Q2 is not electrically connected to the body of the transistor Q2, and the body of the transistor Q2 is floating. Therefore, the voltage stress between the source and body of the transistor Q2 can be mitigated.

Similarly, the body (i.e., region 980) of the transistor Q1 is fully isolated by the isolation layer of the metal gate 984, and the STI regions 975 and 990. Accordingly, the source (e.g., S1) of the transistor Q1 is not electrically connected to the body (i.e., region 980) of the transistor Q1, and the body (i.e., region 980) of the transistor Q1 is floating. Therefore, the voltage stress between the source and body of the transistor Q1 can be mitigated.

Figure 10A:
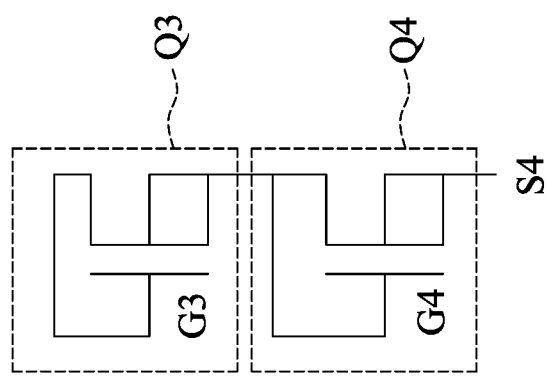
FIG. 10A is a schematic diagram of a cascoded diode chain in accordance with another embodiment of the present disclosure.
Figure 10B:
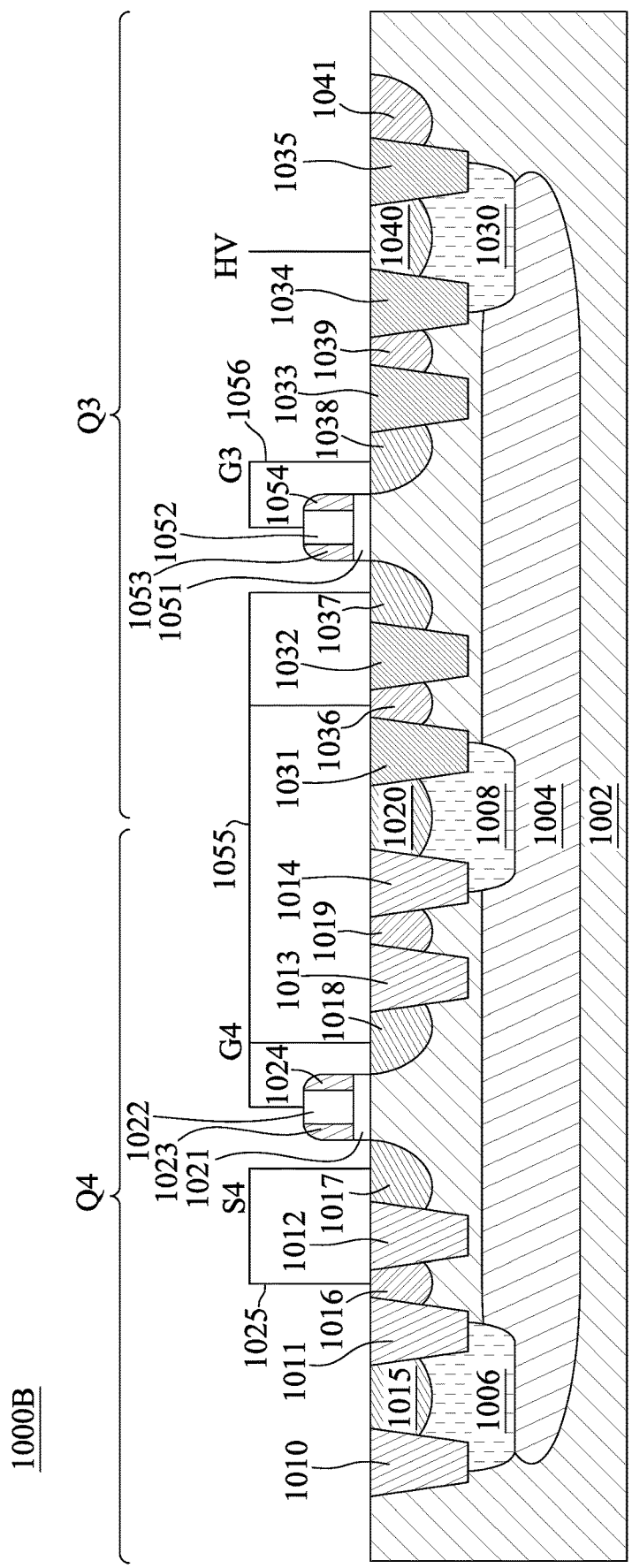
FIG. 10B is a cross section of the cascoded diode chain of FIG. 10A.

FIG. 10A is a schematic diagram of a cascoded diode chain in accordance with another embodiment of the present disclosure. FIG. 10B is a cross section of the cascoded diode chain of FIG. 10A.

In some embodiments, the diode chains in the level shifters 700 and 800 and level detectors 760, 770, 860, 870, and 880 can be implemented using a cascoded diode chain 1000A shown in FIG. 10A to achieve a low quiescent current. For brevity, two N-type transistors Q3 and Q4 with a diode-connected configuration are shown in FIG. 10A. In some embodiments, the transistors Q3 and Q4 are I/O devices with 1.2V voltage stress. In some embodiments, the transistors Q3 and Q4 are core devices with 1.2V voltage stress (e.g., for 2 nm process). The gate oxide of the core devices may be thinner than that of the I/O devices under the same process.

In some embodiments, the N-type transistors Q3 and Q4 are fabricated using deep N-wells, as shown in FIG. 10B. For example, the semiconductor structure 1000B may include a substrate 1002 (e.g., a P-type substrate). The transistors Q3 and Q4 are formed on a substrate 1002, and a deep N-well (DNW) 1004 is formed on the substrate 1002. The N-wells 1006, 1008, and 1030 are formed on the deep N-well 1004. Regions 1016, 1019, 1036, 1039, and 1041 may refer to P-type doped (P+) regions. Regions 1015, 1017, 1018, 1020, 1037, 1038, and 1040 may refer to N-type doped (N+) regions. Regions 1010 to 1013 and 1031 to 1035 may refer to shallow trench isolation (STI) regions. Gate oxides 1021 and 1051 may be formed on the top surface of the substrate 1002. Gate metals 1022 and 1052 may be formed on the gate oxides 1021 and 1051, respectively. The gate spacers 1023 and 1024 may be formed on sidewalls of the gate metal 1022. The gate spacers 1053 and 1054 may be formed on sidewalls of the gate metal 1052.

Specifically, the source (e.g., region 1038) of the transistor Q3 is electrically connected to the gate (e.g., gate metal 1052) of the transistor Q3 through metal wire 1056. The source S4 (e.g., region 1016) of the transistor Q4 is electrically connected to the body (e.g., region 1016) of the transistor Q4 through metal wire 1025. The drain (e.g., region 1018) of the transistor Q4 is electrically connected to the gate (e.g., 1022) of the transistor Q4, and the body (e.g., region 1036) and source (e.g., region 1037) of the transistor Q3 through metal wire 1055. Since the transistors Q3 and Q4 have respective bodies (e.g., regions 1036 and 1016), the source (e.g., region 1017) of the transistor Q4 can be electrically connected to the respective body (e.g., region 1016) so as to mitigate the voltage stress between the source and body of the transistor Q4.

Figure 10C:
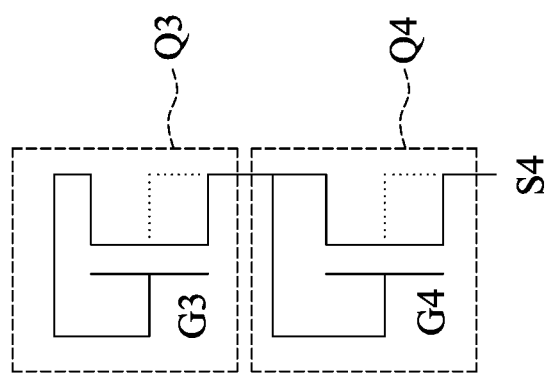
FIG. 10C is a schematic diagram of a cascoded diode chain in accordance with another embodiment of the present disclosure.
Figure 10D:
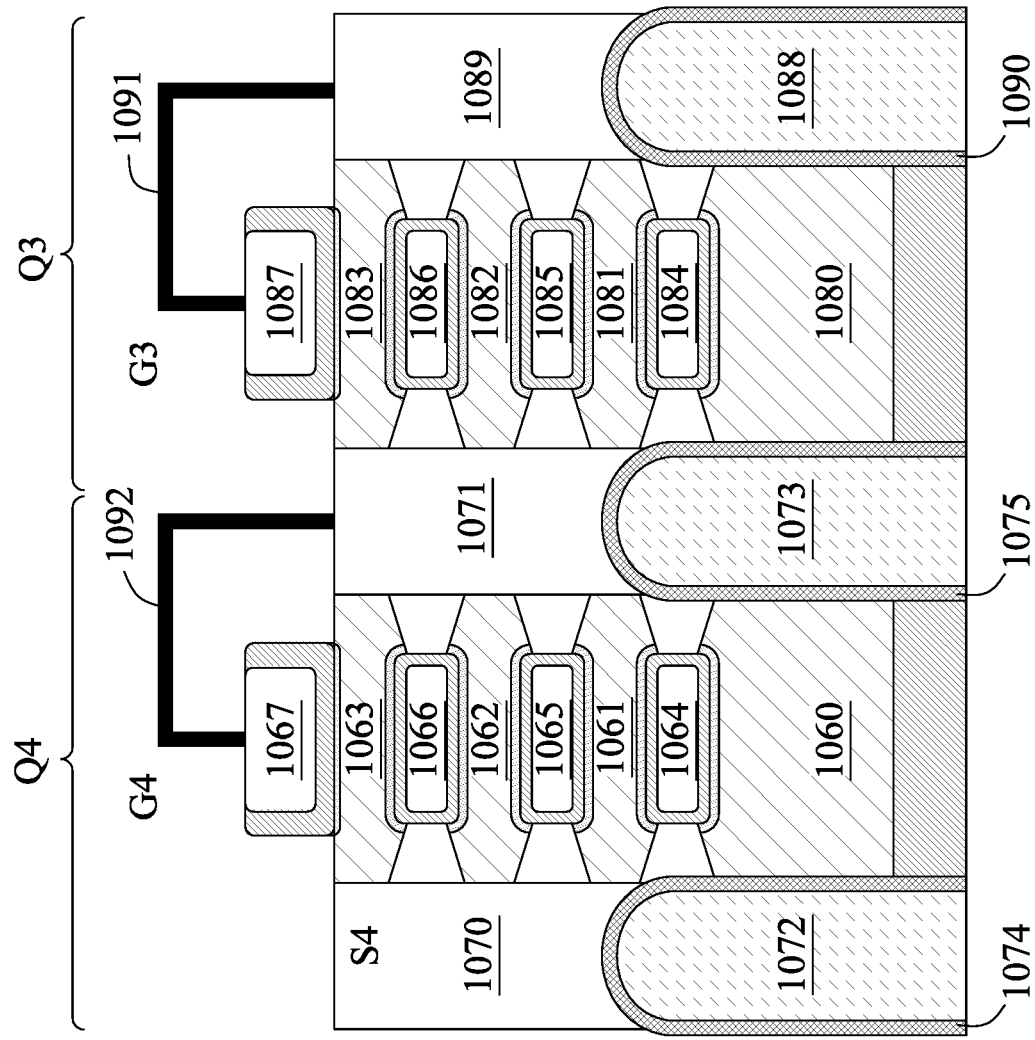
FIG. 10D is a cross section of the cascoded diode chain of FIG. 10C.

FIG. 10C is a schematic diagram of a cascoded diode chain in accordance with another embodiment of the present disclosure. FIG. 10D is a cross section of the cascoded diode chain of FIG. 10C.

In some embodiments, the diode chains in the level shifters 700 and 800 and level detectors 760, 770, 860, 870, and 880 can be implemented using a cascoded diode chain 1000C shown in FIG. 10C to achieve a low quiescent current. For brevity, two N-type transistors Q3 and Q4 with a diode-connected configuration are shown in FIG. 10C. The transistors Q3 and Q4 are fabricated using a super power rail structure as shown by the semiconductor structure 1000D in FIG. 10D.

In some embodiments, the semiconductor structure 1000D includes P-type epitaxial layers (PEPI) 1070, 1071, and 1089, metal gates 1064 to 1067 and 1084 to 1087, floating regions 1060 to 1063 and 1080 to 1083, shallow trench isolation (STI) regions 1074, 1075, and 1090. The transistors Q3 and Q4 may share the PEPI 1071, which is the drain of the transistor Q4 and the source of the transistor Q3. The regions 1060 and 1080 may include respective substrates as bodies of the transistor Q4 and Q3, respectively. The metal gates 1064 to 1067 may be surrounded by corresponding isolation layers, as shown in FIG. 10D. The regions 1072, 1073, and 1088 may refer to body vias (VB) that are electrically connected to other elements on the same semiconductor wafer (not shown).

The regions 1060 to 1063 and 1080 to 1083 may be regarded as floating regions. For example, the body (i.e., region 1060) of the transistor Q4 is fully isolated by the isolation layer of the metal gate 1064, and the STI regions 1074 and 1075. Accordingly, the source (i.e., PEPI 1070) of the transistor Q4 is not electrically connected to the body (i.e., region 1060) of the transistor Q4, and the body of the transistor Q4 is floating. Therefore, the voltage stress between the source and body of the transistor Q4 can be mitigated.

Similarly, the body (i.e., region 1080) of the transistor Q3 is fully isolated by the isolation layer of the metal gate 1084, and the STI regions 1075 and 1090. Accordingly, the source (e.g., PEPI 1071) of the transistor Q3 is not electrically connected to the body (i.e., region 1080) of the transistor Q3, and the body (i.e., region 1080) of the transistor Q3 is floating. Therefore, the voltage stress between the source and body of the transistor Q3 can be mitigated.

Figure 11:
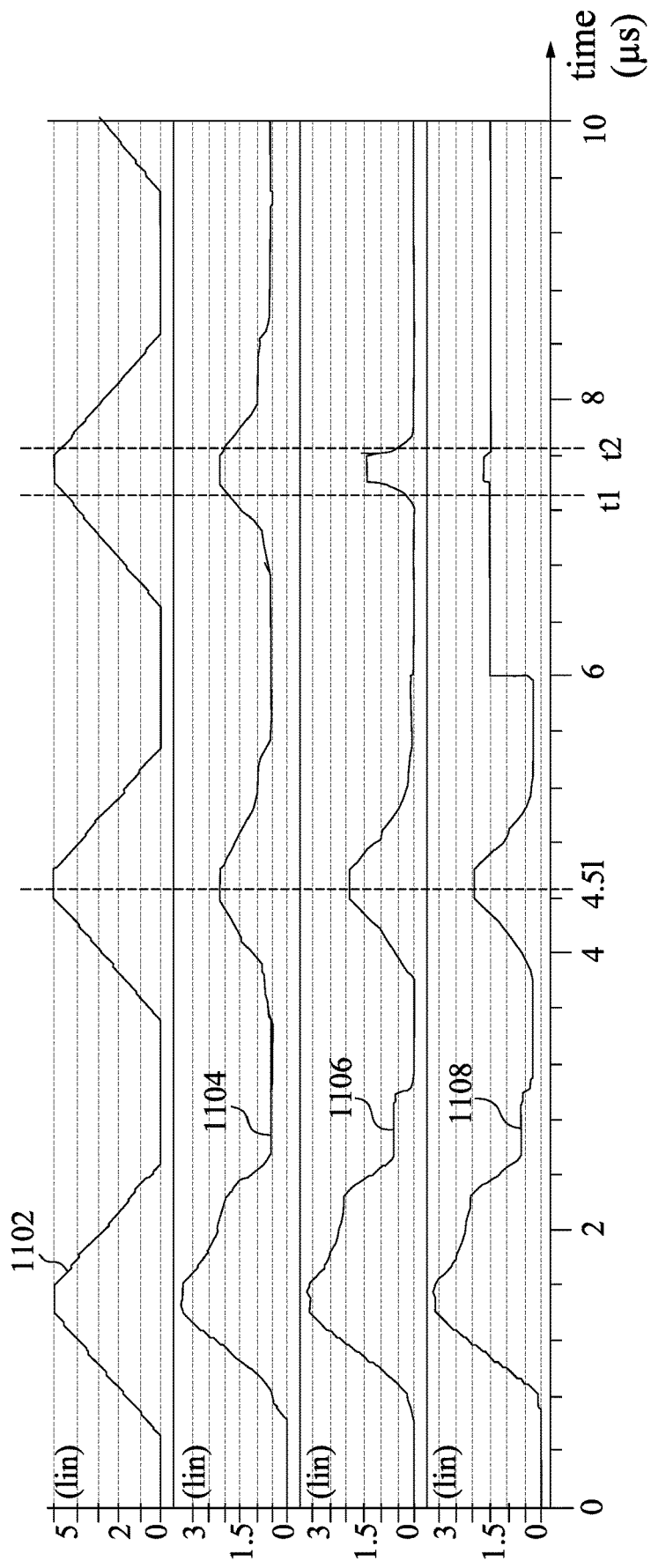
FIG. 11 is a waveform diagram of the bias voltage in different embodiments of the present disclosure.

FIG. 11 is a waveform diagram of the bias voltage in different embodiments of the present disclosure.

In some embodiments, curve 1102 illustrates the waveform of the power supply voltage VPP over time. Curve 1104 illustrates the waveform of the bias voltage VCB over time in the embodiment of FIGS. 2A and 3B. Curve 1106 illustrates the waveform of the cascoded bias voltage VPCB over time in the embodiment of FIGS. 7A-7D. Curve 1108 illustrates the waveform of the cascoded bias voltage VNCB over time in the embodiment of FIGS. 7A-7D.

In some embodiments, the bias voltage VCB generated by the voltage divider 300B is floating when the power supply voltage VPP is in a low voltage range (e.g., VPP< (N1+N2)*VD), as shown by curve 1104.

In some embodiments, referring to curve 1106 the cascoded bias voltage VPCB (e.g., for P-type transistors M3 and M4 of the level shifter 700) is pulled down to the ground when the power supply voltage VPP is in a low voltage range. In addition, the cascoded bias voltage VPCB may be kept at a fixed ratio of the power supply voltage VPP when the power supply voltage VPP is sufficiently high, such as the period between time t1 and t2.

In some embodiments, referring to curve 1108, the cascoded bias voltage VNCB (e.g., for N-type transistors M5 and M6 of the level shifter 700) is kept at the reference voltage VREF when the power supply voltage VPP is in a low voltage range. In addition, the cascoded bias voltage VNCB may be kept at a fixed ratio of the power supply voltage VPP when the power supply voltage VPP is sufficiently high, such as the period between time t1 and t2.

Figure 12B:
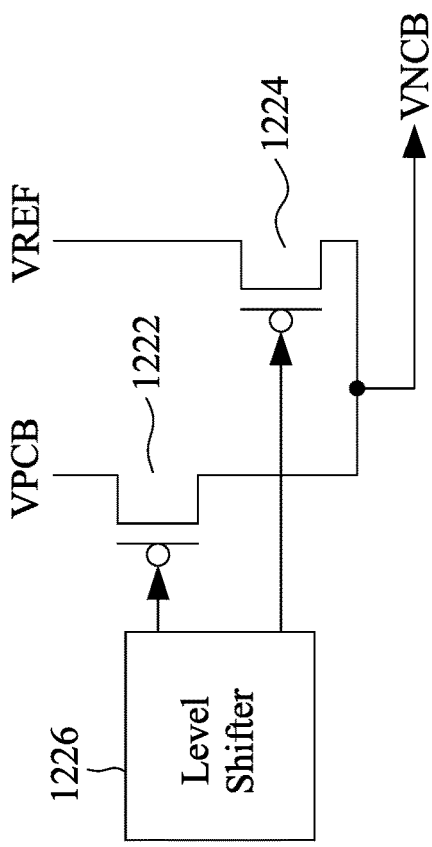
FIG. 12B is another schematic diagram of the voltage selection circuit 520 of FIG. 5A.
Figure 12A:
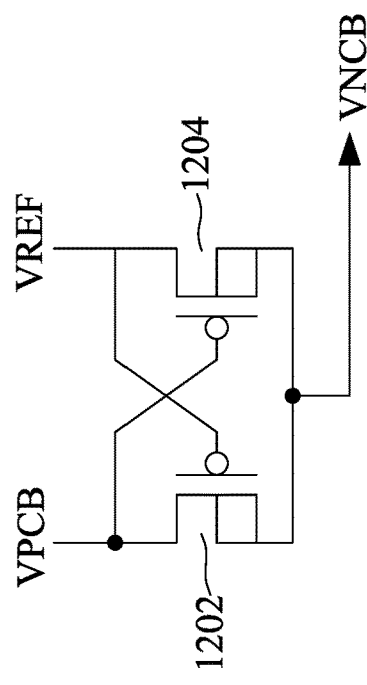
FIG. 12A is a schematic diagram of the voltage selection circuit 520 of FIG. 5A.

FIG. 12A is a schematic diagram of the voltage selection circuit 520 of FIG. 5A. FIG. 12B is another schematic diagram of the voltage selection circuit 520 of FIG. 5A.

In some embodiments, the voltage selection circuit 520 shown in FIG. 5A can be implemented using the voltage selection circuit 1200 which includes transistors 1202 and 1204, as shown in FIG. 12A. When the cascoded bias voltage VPCB is higher than or equal to the reference voltage VREF, the cascoded bias voltage VNCB is dominated by the cascoded bias voltage VPCB, and the cascoded bias voltage VPCB is selected as the cascode bias voltage VNCB. When the cascode bias voltage VPCB is lower than the reference voltage VREF, the cascoded bias voltage VNCB is dominated by the reference voltage VREF, and the reference voltage VREF is selected as the cascoded bias VNCB.

In some embodiments, the voltage selection circuit 520 shown in FIG. 5A can be implemented using the voltage selection circuit 1220 which includes transistors 1222 and 1224, as shown in FIG. 12B. The transistors 1222 and 1224 may be turned on by respective control signals from a high-voltage level shifter 1226. When the cascoded bias voltage VPCB is higher than or equal to the reference voltage VREF, the cascoded bias voltage VNCB is dominated by the cascoded bias voltage VPCB, and the cascoded bias voltage VPCB is selected as the cascode bias voltage VNCB. When the cascode bias voltage VPCB is lower than the reference voltage VREF, the cascoded bias voltage VNCB is dominated by the reference voltage VREF, and the reference voltage VREF is selected as the cascoded bias VNCB.

Figure 12D:
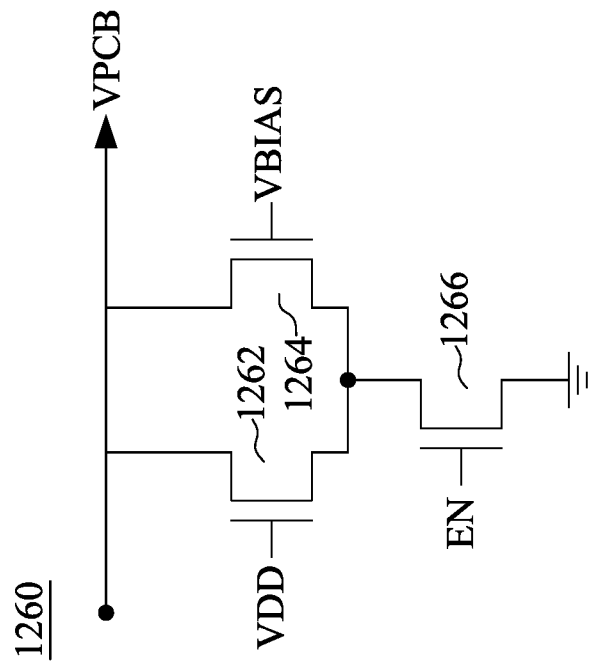
FIG. 12D is another schematic diagram of the voltage pull-down circuit 750 of FIG. 7A.
Figure 12C:
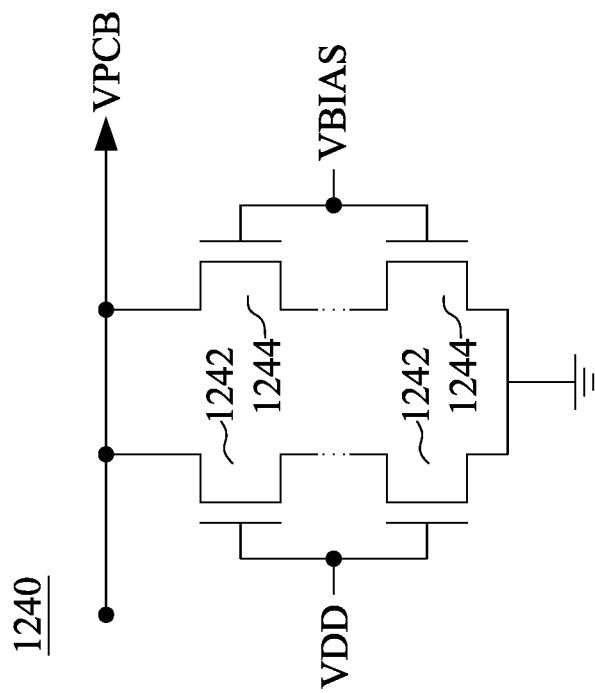
FIG. 12C is a schematic diagram of the voltage pull-down circuit 750 of FIG. 7A.

FIG. 12C is a schematic diagram of the voltage pull-down circuit 750 of FIG. 7A. FIG. 12D is another schematic diagram of the voltage pull-down circuit 750 of FIG. 7A.

In some embodiments, the voltage pull-down circuit 750 in FIG. 7A provides an auxiliary path with current I2 to pull down the cascoded bias voltage VPCB to the ground when the power supply voltage VPP is in a low voltage range. In addition to FIG. 7B, the voltage pull-down circuit 750 in FIG. 7A can be implemented using the voltage pull-down circuit 1240 shown in FIG. 12C. For example, the voltage pull-down circuit 1240 may include dual paths such as a first path and a second path. The first path includes a plurality of transistors 1242 controlled by the power supply voltage VDD. The second path includes a plurality of transistors 1244 controlled by a bias voltage VBIAS generated from an external control circuit (not shown). In some embodiments, the voltage pull-down circuit 1240 may include additional paths controlled by respective bias voltages. In some embodiments, the voltage pull-down circuit 1240 may include the first path or the second path. In some embodiments, the transistors 1242 and 1244 may be low-voltage (LV) devices, and can be replaced by a high-voltage device.

In some embodiments, the voltage pull-down circuit 750 in FIG. 7A can be implemented using the voltage pull-down circuit 1260 shown in FIG. 12D. The voltage pull-down circuit 1260 in FIG. 12D may be similar to the voltage pull-down circuit 1260 in FIG. 12C, with the difference therebetween that the voltage pull-down circuit 1260 further includes an enable control function. For example, the voltage pull-down circuit 1260 includes a transistor 1266 controlled by an enable signal EN generated by an external control circuit (not shown). When the enable signal EN is in the high logic state, the auxiliary path is enabled. When the enable signal EN is in the low logic state, the auxiliary path is disabled.

Figure 13A:
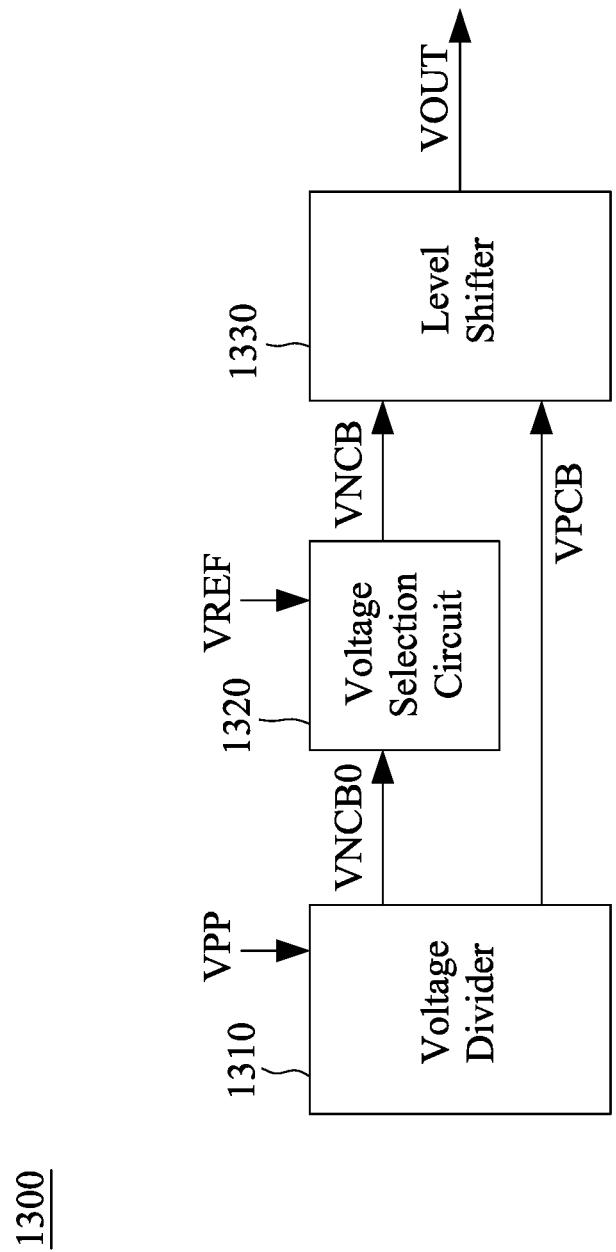
FIG. 13A is a block diagram of a bias voltage generator 1300 in accordance with another embodiment of the present disclosure.
Figure 13B:
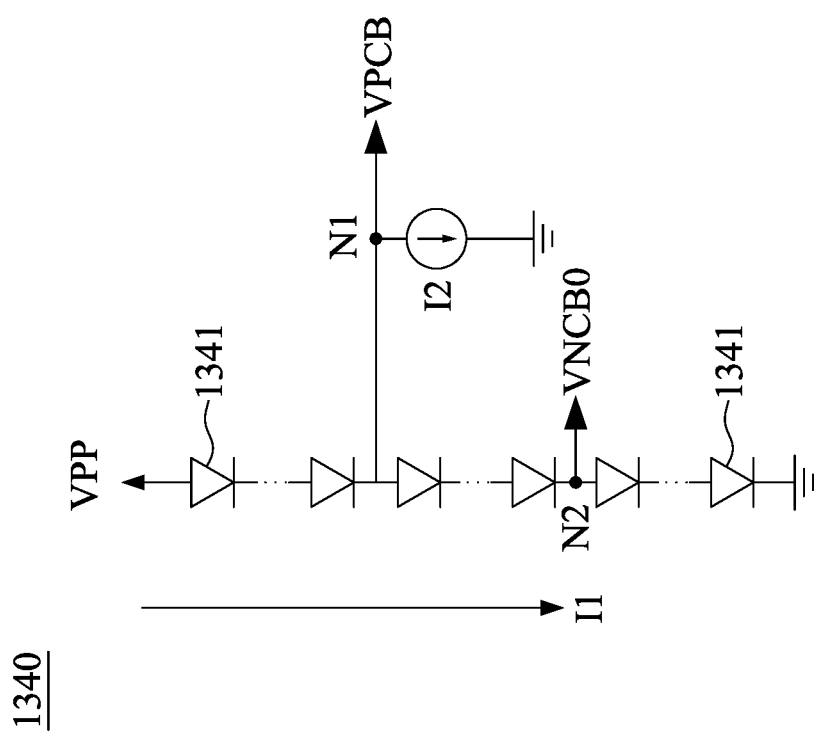
FIG. 13B is a schematic diagram of a voltage divider 1340 in accordance with an embodiment of the present disclosure.

FIG. 13A is a block diagram of a bias voltage generator 1300 in accordance with another embodiment of the present disclosure. FIG. 13B is a schematic diagram of a voltage divider 1340 in accordance with an embodiment of the present disclosure.

In an embodiment, the bias voltage generator 1300 shown in FIG. 13A is similar to the bias voltage generator 500 shown in FIG. 5A, with the difference therebetween that the voltage divider 1310 outputs a cascode bias voltage VNCB0 to the voltage selection circuit 1320, and the voltage selection circuit 1320 select the maximum between the cascode bias voltage VNCB0 and the reference voltage VREF.

In some embodiments, the voltage divider 1310 shown in FIG. 13A can be implemented using the voltage divider 1340 shown in FIG. 13B. The voltage divider 1340 includes N diodes 1341. The voltage levels of the cascoded bias voltages VNCB0 and VPCB are determined based on the position of output terminals in the diode chain. In addition, the auxiliary path (e.g., current I2) may follow the output terminal of the cascoded bias voltage VPCB. The details of the auxiliary path can be referred to the embodiments of FIGS. 7B, 12C, and 12D.

For purposes of description, the cascoded bias voltage VPCB is higher than the cascoded bias VNCB0 when the diode chain of the voltage divider 1340 is activated (e.g., VPP>N*VD to induce current I1). In some embodiments, the cascoded bias voltage VNCB0 is higher than the cascoded bias VPCB when the diode chain of the voltage divider 1340 is activated.

Figure 13D:
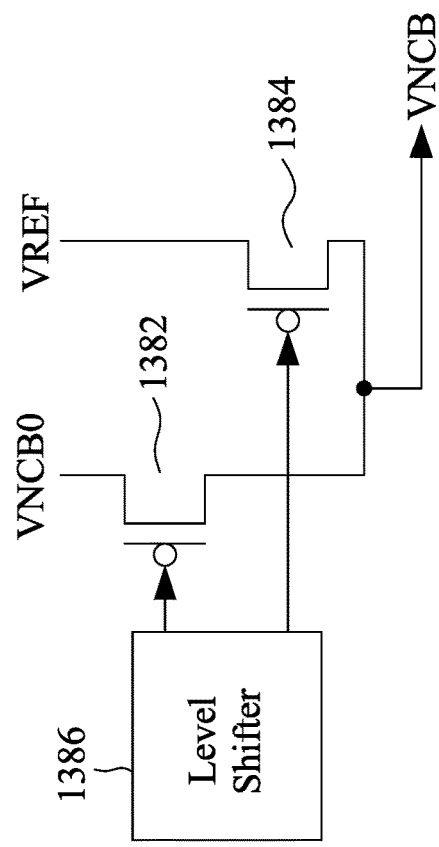
FIG. 13D is a schematic diagram of the voltage selection circuit 1380 in accordance with another embodiment of the present disclosure.
Figure 13C:
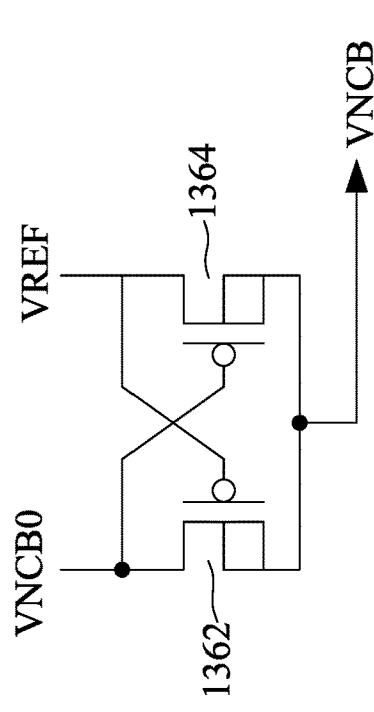
FIG. 13C is a schematic diagram of a voltage selection circuit 1360 in accordance with an embodiment of the present disclosure.

FIG. 13C is a schematic diagram of a voltage selection circuit 1360 in accordance with an embodiment of the present disclosure. FIG. 13D is a schematic diagram of the voltage selection circuit 1380 in accordance with another embodiment of the present disclosure.

In some embodiments, the voltage selection circuit 1320 shown in FIG. 13A can be implemented using the voltage selection circuit 1360 shown in FIG. 13C. For example, the voltage selection circuit 1360 includes transistors 1362 and 1364, as shown in FIG. 13C. When the cascoded bias voltage VNCB0 is higher than or equal to the reference voltage VREF, the cascoded bias voltage VNCB is dominated by the cascoded bias voltage VNCB0, and the cascoded bias voltage VNCB0 is selected as the cascoded bias voltage VNCB. When the cascode bias voltage VNCB0 is lower than the reference voltage VREF, the cascoded bias voltage VNCB is dominated by the reference voltage VREF, and the reference voltage VREF is selected as the cascoded bias voltage VNCB.

In some embodiments, the voltage selection circuit 1320 shown in FIG. 13A can be implemented using the voltage selection circuit 1380 which includes transistors 1382 and 1384, as shown in FIG. 13D. The transistors 1382 and 1384 may be turned on by respective control signals from a high-voltage level shifter 1386. When the cascoded bias voltage VNCB0 is higher than or equal to the reference voltage VREF, the cascoded bias voltage VNCB is dominated by the cascoded bias voltage VNCB0, and the cascoded bias voltage VNCB0 is selected as the cascoded bias voltage VNCB. When the cascode bias voltage VNCB0 is lower than the reference voltage VREF, the cascoded bias voltage VNCB is dominated by the reference voltage VREF, and the reference voltage VREF is selected as the cascoded bias voltage VNCB.

An aspect of the present disclosure provides a semiconductor device which includes a voltage divider, a voltage selection circuit, and a level shifter. The voltage divider is configured to divide a power supply voltage to generate a first bias voltage. The voltage selection circuit is configured to select between the first bias voltage and a reference voltage to output a second bias voltage. The level shifter is configured to adjust a voltage level of the power supply voltage using the first bias voltage and the second bias voltage.

Another aspect of the present disclosure provides a bias voltage generator which includes a voltage divider, a voltage selection circuit, and a level shifter. The voltage divider is configured to divide a power supply voltage to generate a first bias voltage and a second bias voltage. The voltage selection circuit is configured to select between the second bias voltage and a reference voltage to output a third bias voltage. The level shifter is configured to adjust a voltage level of the power supply voltage using the first bias voltage and the third bias voltage.

Yet another aspect of the present disclosure provides a bias voltage generator which includes a voltage divider, a voltage selection circuit, and a level shifter. The voltage divider includes a diode chain configured to generate a first bias voltage at an adjustable ratio of a power supply voltage in response to the power supply voltage being higher than or equal to a first voltage level. The voltage selection circuit is configured to select a maximum from the first bias voltage and a reference voltage to output a second bias voltage. The level shifter is configured to adjust a voltage level of the power supply voltage using the first bias voltage and the second bias voltage.

The methods and features of the present disclosure have been sufficiently described in the provided examples and descriptions. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope processes, machines, manufacture, compositions of matter, means, methods or steps. In addition, each claim constitutes a separate embodiment, and the combination of various claims and embodiments are within the scope of the present disclosure.

What is claimed is:

1. A semiconductor device, comprising:
   a voltage divider, configured to divide a power supply voltage to generate a first bias voltage;
   a voltage selection circuit, configured to select between the first bias voltage and a reference voltage to output a second bias voltage; and
   a level shifter, configured to adjust a voltage level of the power supply voltage using the first bias voltage and the second bias voltage.

2. The semiconductor device of claim 1, wherein the voltage divider comprises:
   a first stage, comprising a first number of diodes connected in series and coupled between the power supply voltage and a first node outputting the first bias voltage;
   a second stage, comprising a second number of diodes connected in series and coupled between the first node and a second node;
   a third stage, comprising a third number of diodes connected in series and coupled between the second node and a third node;
   a fourth stage, comprising a fourth number of diodes connected in series and coupled between the third node and a ground;
   a voltage pull-down circuit, coupled between the first node and the ground, and configured to provide a first current from the first node to the ground;
   a first switch, coupled between the second node and the ground; and
   a second switch, coupled between the third node and the ground.

3. The semiconductor device of claim 2, wherein the voltage divider further comprises:

a first level detector, configured to detect whether the power supply voltage is at a first voltage level to enable the first stage, the second stage, and the third stage; and a second level detector, configured to detect whether the power supply voltage is at a second voltage level to enable the first stage and the second stage, wherein the first voltage level is higher than the second voltage level.

4. The semiconductor device of claim 3, wherein when the power supply voltage is lower than the first voltage level, the first bias voltage is pulled down to the ground by the voltage pull-down circuit.

5. The semiconductor device of claim 3, wherein:
the first level detector comprises:
a fifth number of diodes connected in series and coupled between the power supply voltage and a fourth node;
a first current source, coupled between the fourth node and the ground; and
a first inverter, receiving a voltage at the fourth node to output a first control signal for controlling the second switch;
the second level detector comprises:
a sixth number of diodes connected in series and coupled between the power supply voltage and a fifth node;
a second current source, coupled between the fifth node and the ground; and
a second inverter, receiving a first voltage at the fifth node to output a second control signal for controlling the first switch.

6. The semiconductor device of claim 5, wherein the fifth number equals to the first number plus the second number plus the third number, and the sixth number equals to the first number plus the second number.

7. The semiconductor device of claim 6, wherein when the power supply voltage is at the second voltage level, a second current is induced from the power supply voltage to the ground through the first stage and the second stage,
wherein the second current is larger than the first current.

8. The semiconductor device of claim 5, wherein the diodes are implemented using transistors with a diode-connected configuration.

9. The semiconductor device of claim 8, wherein the transistors are P-type transistors fabricated using separated N-wells formed on a semiconductor substrate.

10. The semiconductor device of claim 8, wherein the transistors are N-type transistors fabricated on a deep N-well formed on a semiconductor substrate.

11. The semiconductor device of claim 8, wherein the transistors are fabricated using a super power rail architecture, and each of the transistors comprises: a gate, a drain, a source electrically connected to the gate, and a body isolated from the source.

12. The semiconductor device of claim 5, wherein the voltage divider further comprises:
a third switch, coupled between the first node and the ground; and
a third level detector, configured to detect whether the power supply voltage is at a third voltage level to enable the first stage.

13. The semiconductor device of claim 12, wherein the third level detector comprises:
a seventh number of diodes connected in series and coupled between the power supply voltage and a sixth node;
a switch, controlled by a second power supply voltage;

a third current source, coupled between the sixth node and the ground; and
a third inverter, receiving a second voltage at the sixth node to output a third control signal for controlling the third switch,
wherein the seventh number equals to the first number.

14. A bias voltage generator, comprising:
a voltage divider, configured to divide a power supply voltage to generate a first bias voltage and a second bias voltage;
a voltage selection circuit, configured to select between the second bias voltage and a reference voltage to output a third bias voltage; and
a level shifter, configured to adjust a voltage level of the power supply voltage using the first bias voltage and the third bias voltage.

15. The bias voltage generator of claim 14, wherein the voltage divider comprises:
a diode chain, comprising a plurality of diodes connected in series, wherein the diodes comprises:
a first section coupled between the power supply voltage and a first node;
a second section coupled between the first node and a second node; and
a third section coupled between the second node and a ground; and
an auxiliary current path, coupled between the first node and the ground, and providing a first current from the first node to the ground.

16. The bias voltage generator of claim 15, wherein when the power supply voltage reaches a first voltage level to enable the diode chain, a second current is induced from the power supply voltage to the ground through the diode chain, and the second current is greater than the first current,
wherein when the power supply voltage is lower than the first voltage level, the first bias voltage is pulled down to the ground through the auxiliary current path.

17. A bias voltage generator, comprising:
a voltage divider, comprising a diode chain to generate a first bias voltage at an adjustable ratio of a power supply voltage in response to the power supply voltage being higher than or equal to a first voltage level;
a voltage selection circuit, configured to select a maximum from the first bias voltage and a reference voltage to output a second bias voltage; and
a level shifter, configured to adjust a voltage level of the power supply voltage using the first bias voltage and the second bias voltage.

18. The bias voltage generator of claim 17, wherein the diode chain comprises a plurality of diode-connected transistors, and the diode-connected transistors comprise respective bodies.

19. The bias voltage generator of claim 18, wherein the voltage divider further comprises a voltage pull-down circuit configured to pull down the first bias voltage to a ground when the power supply voltage is lower than the first voltage level.

20. The bias voltage generator of claim 19, wherein when the power supply voltage is between the first voltage level and a second voltage level, the adjustable ratio is equal to a first ratio,
wherein when the power supply voltage is between the second voltage level and a third voltage level, the adjustable ratio is equal to a second ratio,
wherein when the power supply voltage is higher than the third voltage level, the adjustable is equal to a third ratio, wherein the third voltage level is higher than the second voltage level, and the second voltage level is higher than the first voltage level, wherein the third ratio is greater than the second ratio, and the second ratio is greater than the first ratio.

* * * * *